US012604646B2

(12) United States Patent
Jeong et al.

(10) Patent No.: US 12,604,646 B2
(45) Date of Patent: Apr. 14, 2026

(54) DISPLAY PANEL WITH INORGANIC ENCAPSULATION LAYER HAVING MULTIPLE LAYERS ON INORGANIC ABSORPTION LAYER

(71) Applicant: Samsung Display Co., Ltd., Yongin-si (KR)

(72) Inventors: Seungyeon Jeong, Yongin-si (KR); Ohjeong Kwon, Yongin-si (KR); Su Jeong Kim, Yongin-si (KR); Taeho Kim, Yongin-si (KR); Hong-Jo Park, Yongin-si (KR); Hongyeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 299 days.

(21) Appl. No.: 18/322,500

(22) Filed: May 23, 2023

(65) Prior Publication Data

US 2024/0032405 A1 Jan. 25, 2024

(30) Foreign Application Priority Data

Jul. 20, 2022 (KR) ........................ 10-2022-0089900

(51) Int. Cl.
*H10K 59/80* (2023.01)
*H10K 50/844* (2023.01)
*H10K 50/858* (2023.01)
*H10K 59/10* (2023.01)
(52) U.S. Cl.
CPC ......... *H10K 59/879* (2023.02); *H10K 59/873* (2023.02)

(58) Field of Classification Search
CPC .............. H10K 59/879; H10K 59/873; H10K 59/8791; H10K 59/10; H10K 59/878; H10K 59/8792; H10K 50/844; H10K 50/858
See application file for complete search history.

(56) References Cited

U.S. PATENT DOCUMENTS

| | | | |
|---|---|---|---|
| 9,843,023 B2 | 12/2017 | Cho et al. | |
| 9,966,567 B2 | 5/2018 | Kim et al. | |
| 10,811,634 B2 | 10/2020 | Song et al. | |
| 11,195,884 B2 | 12/2021 | Kim et al. | |

(Continued)

FOREIGN PATENT DOCUMENTS

| | | |
|---|---|---|
| KR | 10-2016-0036722 A | 4/2016 |
| KR | 10-2016-0082864 A | 7/2016 |

(Continued)

*Primary Examiner* — Herve-Louis Y Assouman
(74) *Attorney, Agent, or Firm* — Womble Bond Dickinson (US) LLP

(57) ABSTRACT

A display panel includes a base layer, a light-emitting element layer on the base layer, a capping layer on the light-emitting element layer, an inorganic absorption layer on the capping layer, and having a refractive index of about 1.8 to about 3.0, and an encapsulation layer on the inorganic absorption layer, and including a first layer, a second layer, and a third layer that are sequentially stacked, wherein the first layer includes: a first sub layer on the inorganic absorption layer, and having a first refractive index of about 1.77 or more, and a second sub layer on the first sub layer, and having a second refractive index lower than the first refractive index.

22 Claims, 15 Drawing Sheets

(56)                     References Cited

U.S. PATENT DOCUMENTS

| | | | |
|---|---|---|---|
| 2016/0093828 A1* | 3/2016 | Kim | H10K 59/8731 |
| | | | 257/40 |
| 2016/0197308 A1* | 7/2016 | Jeong | H10K 59/879 |
| | | | 257/40 |
| 2018/0113529 A1* | 4/2018 | Shingai | B32B 15/08 |
| 2020/0083490 A1* | 3/2020 | Zhang | H10K 59/8791 |
| 2020/0280023 A1* | 9/2020 | Ha | H10K 50/115 |
| 2020/0350387 A1* | 11/2020 | Kim | H10K 59/124 |
| 2022/0238848 A1 | 7/2022 | Kwon et al. | |

FOREIGN PATENT DOCUMENTS

| | | |
|---|---|---|
| KR | 10-2016-0083986 A | 7/2016 |
| KR | 10-2019-0076090 A | 7/2019 |
| KR | 10-2020-0097373 A | 8/2020 |
| KR | 10-2022-0005099 A | 1/2022 |
| KR | 10-2022-0108287 A | 8/2022 |

* cited by examiner

DP

IL2

OL

IL1-3a

T3-1

T2-1 — IL1-2      IL1      TFE

T1 — IL1-1

INF

CPL

EL2

ETR

EML      DP-ED

HTR

EL1

DR3

DR2  DR1

DISPLAY PANEL WITH INORGANIC ENCAPSULATION LAYER HAVING MULTIPLE LAYERS ON INORGANIC ABSORPTION LAYER

CROSS-REFERENCE TO RELATED APPLICATION

This application claims priority to and the benefit of Korean Patent Application No. 10-2022-0089900, filed on Jul. 20, 2022, in the Korean Intellectual Property Office, the entire content of which is hereby incorporated by reference.

BACKGROUND

1. Field

Aspects of embodiments of the present disclosure herein relate to a display panel and a display device including the same.

2. Description of Related Art

Various display devices used in multimedia apparatuses such as televisions, mobile phones, tablet computers, and game consoles are being developed. Display devices may include various optical function layers to provide high quality color images to a user.

Recently, research on thin display devices has been conducted to achieve various types of display devices such as display devices having curved surfaces, rollable display devices, or foldable display devices. For example, a thin display device may be achieved by reducing the number of optical function layers and including an optical function layer with various functions. However, by doing so in a thin display device, luminous efficiency of light-emitting element may be reduced. This has motivated further research on display devices having high efficiency.

The above information disclosed in this Background section is for enhancement of understanding of the background of the present disclosure, and therefore, it may contain information that does not constitute prior art.

SUMMARY

Aspects of some embodiments of the present disclosure are directed to a display panel with improved luminous efficiency of a light-emitting element.

Aspects of some embodiments of the present disclosure are also directed to a display device with improved light extraction efficiency, including the display panel described above.

According to some embodiments, there is provided a display panel including: a base layer; a light-emitting element layer on the base layer; a capping layer on the light-emitting element layer; an inorganic absorption layer on the capping layer, and having a refractive index of about 1.8 to about 3.0; and an encapsulation layer on the inorganic absorption layer, and including a first layer, a second layer, and a third layer that are sequentially stacked, wherein the first layer includes: a first sub layer on the inorganic absorption layer, and having a first refractive index of about 1.77 or more; and a second sub layer on the first sub layer, and having a second refractive index lower than the first refractive index.

In some embodiments, the second refractive index is about 1.5 or less.

In some embodiments, the first sub layer has a thickness of about 500 Å to about 600 Å or about 1500 Å to about 1750 Å, and the second sub layer has a thickness of about 7000 Å to about 10000 Å.

In some embodiments, the first layer further includes a third sub layer on the second sub layer, and having a third refractive index lower than the first refractive index.

In some embodiments, the first layer further includes a third sub layer on the second sub layer, and having a fourth refractive index higher than the second refractive index.

In some embodiments, the second refractive index is about 1.5 or less, and the third refractive index is about 1.70 or less.

In some embodiments, the third refractive index is about 0.

In some embodiments, the first sub layer has a thickness of about 500 Å to about 600 Å, the second sub layer has a thickness of about 7000 Å to about 10000 Å, and the third sub layer has a thickness of about 550 Å to about 750 Å.

In some embodiments, the third sub layer has a thickness of about 7000 Å to about 10000 Å.

In some embodiments, the second refractive index is about 1.5 or less, and the fourth refractive index is about 1.65 or more.

In some embodiments, the first sub layer has a thickness of about 500 Å to about 600 Å, and the second sub layer has a thickness of about 800 Å to about 2000 Å.

In some embodiments, a refractive index of the capping layer is higher than the refractive index of the inorganic absorption layer, and a difference between the refractive index of the capping layer and the refractive index of the inorganic absorption layer is about 0.15 or more.

In some embodiments, the first layer includes silicon oxynitride ($SiO_xN_y$).

In some embodiments, the inorganic absorption layer includes bismuth (Bi).

According to some embodiments, there is provided a display panel including: a base layer; a light-emitting element layer on the base layer; a capping layer on the light-emitting element layer; an inorganic absorption layer on the capping layer; and an encapsulation layer on the inorganic absorption layer, and including a first layer, a second layer, and a third layer that are sequentially stacked, wherein the first layer includes a first sub layer and a second sub layer, each of the first and second sub layers includes silicon oxynitride ($SiO_xN_y$), the silicon oxynitride ($SiO_xN_y$) of the first sub layer having a higher nitrogen content than the silicon oxynitride ($SiO_xN_y$) of the second sub layer.

In some embodiments, the first sub layer has a first refractive index of about 1.77 or more, and has a thickness of about 500 Å to about 600 Å or about 1500 Å to about 1750 Å, and the second sub layer has a second refractive index of about 1.5 or less, and has a thickness of about 7000 Å to about 10000 Å.

In some embodiments, the first layer further includes a third sub layer including silicon oxynitride ($SiO_xN_y$), the first sub layer, the second sub layer, and the third sub layer are sequentially stacked on the inorganic absorption layer.

In some embodiments, the silicon oxynitride ($SiO_xN_y$) of the third sub layer has a lower nitrogen content than the silicon oxynitride ($SiO_xN_y$) of the first sub layer.

In some embodiments, the silicon oxynitride ($SiO_xN_y$) of the third sub layer has a higher nitrogen content than the silicon oxynitride ($SiO_xN_y$) of the second sub layer.

In some embodiments, the first sub layer has a thickness of about 500 Å to about 600 Å, the second sub layer has a thickness of about 7000 Å to about 10000 Å, and the third sub layer has a thickness of about 550 Å to about 750 Å.

In some embodiments, the first sub layer has a thickness of about 500 Å to about 600 Å, the second sub layer has a thickness of about 800 Å to about 2000 Å, and the third sub layer has a thickness of about 7000 Å to about 10000 Å.

According to some embodiments, there is provided a display device including: a display panel; a sensor layer on the display panel; and a light control layer on the sensor layer, and including at least one of a dye or a pigment, wherein the display panel includes: a base layer, a light-emitting element layer on the base layer, an inorganic absorption layer on the light-emitting element layer, and an encapsulation layer on the inorganic absorption layer, and including at least one inorganic layer and at least one organic layer, the at least one inorganic layer including: a first sub inorganic layer having a first refractive index of about 1.77 or more, and a second sub inorganic layer on the first sub inorganic layer, and having a second refractive index lower than the first refractive index.

In some embodiments, the encapsulation layer includes: a first inorganic layer on the inorganic absorption layer, and including the first sub inorganic layer and the second sub inorganic layer; an organic layer on the first inorganic layer; and a second inorganic layer on the organic layer.

In some embodiments, the first inorganic layer further includes a third sub inorganic layer on the second sub inorganic layer, and the first inorganic layer has a third refractive index lower than the first refractive index or having a fourth refractive index higher than the second refractive index, and the first sub inorganic layer is directly on the inorganic absorption layer.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain some of the principles of the present disclosure. In the drawings.

DETAILED DESCRIPTION

Figure 1:
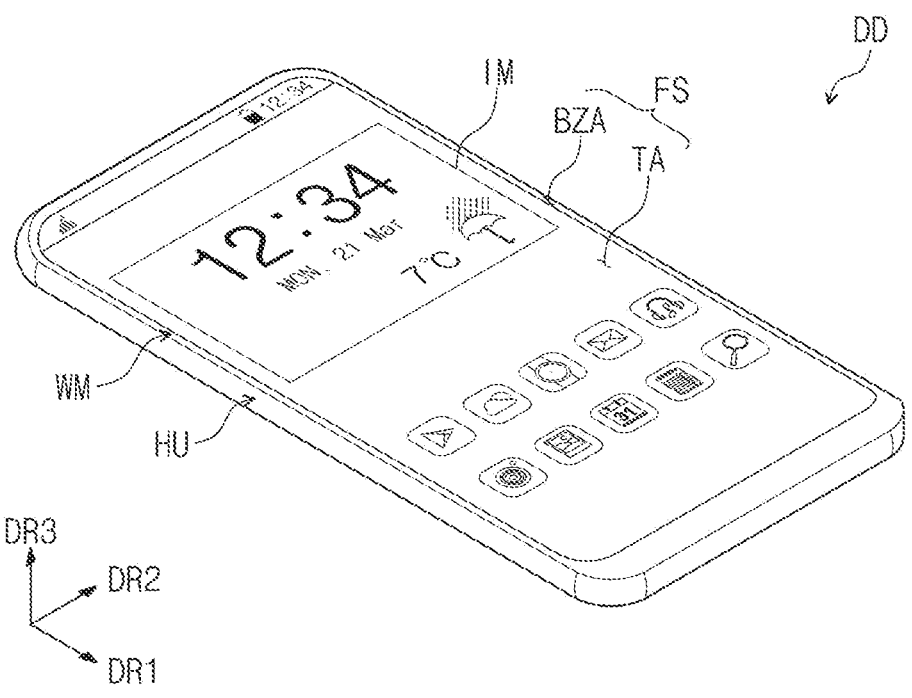
FIG. 1 is a perspective view of a display device according to some embodiments of the present disclosure.

The present invention may be implemented in various forms and have specific embodiments some of which are illustrated in the drawings and described in detail in the text below. It is to be understood, however, that the invention is not intended to be limited to the particular forms disclosed, but on the contrary, is intended to cover all modifications, equivalents, and alternatives falling within the spirit and scope of the invention.

Hereinafter, embodiments will be described in more detail with reference to the accompanying drawings, in which like reference numbers refer to like elements throughout. The present disclosure, however, may be embodied in various forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time or may be performed in an order opposite to the described order.

Hereinafter, a display panel and a display device including the same according to some embodiments of the present disclosure will be described with reference to the accompanying drawings.

Figure 2:
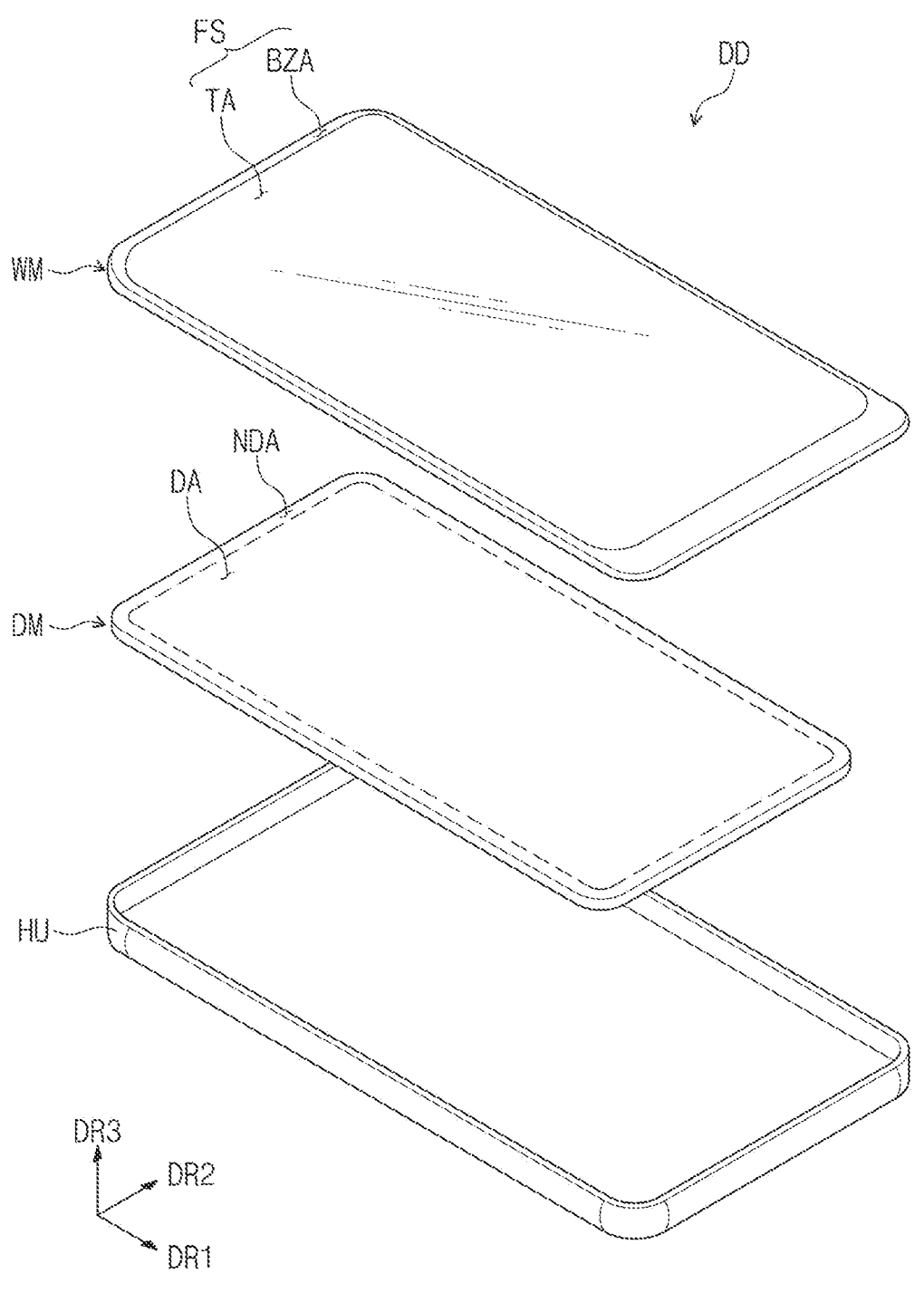
FIG. 2 is an exploded perspective view of a display device according to an embodiment of the present disclosure.

FIG. 1 is a perspective view illustrating a display device according to some embodiments of the present disclosure. FIG. 2 is an exploded perspective view illustrating a display device according to some embodiments of the present disclosure.

Referring to FIG. 1, a display device DD may be a device which is activated in response to an electrical signal. The display device DD may be implemented according to various embodiments. For example, the display device DD may be used for large display devices such as televisions, monitors, outdoor billboards, and/or the like, and may also be used for small-sized and medium-sized display devices such as personal computers, laptop computers, personal digital devices, car navigation units, game consoles, portable electronic devices, cameras, and/or the like. In FIG. 1, the display device DD is exemplarily illustrated as a smartphone.

The display device DD may display an image IM and detect an external input. The display device DD may display the image IM in a third direction DR3 on a display surface FS parallel to each of a first direction DR1 and a second direction DR2. The display surface FS on which the image IM is displayed may correspond to a front surface of the display device DD and a front surface FS of a window WM. Hereinafter, the display surface, the front surface of the display device DD, and the front surface of the window WM may be denoted using the same reference numeral or symbol for ease of description. The image IM may include a still image as well as a dynamic image. In FIG. 1, a clock and a plurality of icons are exemplarily illustrated as the image IM.

For ease of description, hereinafter, the front surface (e.g., the top surface) and the rear surface (e.g., the bottom surface) of each member are defined with respect to the direction in which the image IM is displayed. The front and the rear surfaces may be opposed to each other in the third direction DR3, and the normal direction of each of the front and rear surfaces may be parallel to the third direction DR3. The directions indicated by the first, second, and third directions DR1, DR2, and DR3 are defined relative to one another, and may thus be changed to other directions. As illustrated, the first, second, and third directions DR1, DR2, and DR3 may refer to the first to third directional axes, respectively. In addition, as used herein, the phrases "on a plane" or "in a plan view" may refer to when an object is viewed from the third direction DR3.

The display device DD according to some embodiments of the present disclosure detects a user input applied from the outside. The user input may include various types of external inputs, such as an input by a body part of a user, light, heat, pressure, or the like. The display device DD may detect the user input, which may be applied to the side or rear surfaces of the display device DD according to the structure of the display device DD. However, embodiments of the present disclosure are not limited thereto.

The display device DD may be flexible, which means that the display device DD may have a structure with a flexible feature. This includes all types of structure ranging from a structure that is completely foldable to a structure that is bendable to the nanometer level. For example, the display device DD may be a curved display device or a foldable display device. However, embodiments of the present disclosure are not limited thereto, and the display device DD may, for example, be rigid.

Referring to FIG. 1 and FIG. 2, the display device DD may include a window WM, a display module DM, and a housing HU.

The window WM may include an optically transparent material. The window WM may include an insulation panel. For example, the window WM may include glass, plastic, or a combination thereof.

The front surface FS of the window WM, as described above, may define the front surface FS of the display device DD. The display surface FS may include a transmission region TA and a bezel region BZA. The transmission region TA may be an optically transparent region. For example, the transmission region TA may have a visible light transmittance of about 90% or more.

The bezel region BZA may have a light transmittance relatively lower than the transmission region TA. The bezel region BZA may define a form of the transmission region TA. The bezel region BZA may be adjacent to the transmission region TA, and surround (e.g., be around a periphery of) the transmission region TA. The bezel region BZA may have a suitable color (e.g., predetermined color). The bezel region BZA may cover a non-display region NDA to prevent the non-display region NDA from being viewed from the outside or to reduce visibility thereof. However, embodiments of the present disclosure are not limited thereto, and the bezel region BZA may be omitted from the window WM according to some embodiments of the present disclosure.

The display module DM may display the image IM and detect the external input. The image IM may be displayed on the front surface of the display module DM. In the display module DM, a display region DA and a non-display region NDA may be defined. The display region DA may be the region on which the image IM is displayed, and which detects the external input. The transmission region TA may overlap with the display region DA (e.g., in a plan view). For example, the transmission region TA may overlap with the entire surface or at least a portion of the display region DA (e.g., in a plan view). Accordingly, a user may view the image IM through the transmission region TA or may provide the external input. However, this is only exemplarily illustrated, and embodiments of the present disclosure are not limited thereto. In the display region DA, the region on which the image IM is displayed may be separated from the region in which the external input is detected. However, embodiments of the present disclosure are not limited thereto.

The non-display region NDA may be a region which is covered by the bezel region BZA. The non-display region NDA may be adjacent to the display region DA. The non-display region NDA may surround (e.g., be around a periphery of) the display region DA. The non-display region NDA may be a region on which the image is not displayed. On the non-display region NDA, a drive circuit or a driving wire for driving the display region DA may be disposed. However, in some examples, the non-display region NDA may be omitted from (or not be present in) the display module DM.

The display module DM may include a display panel and a sensor layer. The image IM may be displayed substantially on the display panel, and the external input may be detected substantially at the sensor layer. The display module DM includes both the display panel and the sensor layer, and may thus display the image IM and detect the external input at the same time. A description thereof may be provided in further detail below.

The display device DD according to some embodiments further includes a drive circuit. The drive circuit may include a flexible circuit board and a main circuit board. The flexible circuit board may be electrically connected with the display module DM. The flexible circuit board may connect (e.g., electrically connect) the display module DM with the main circuit board. However, embodiments of the present disclosure are not limited thereto, and the flexible circuit board according to some examples may not be connected to the main circuit board, and may be in fact be a rigid board.

The flexible circuit board may be connected to the pads of the display module DM which are disposed in the non-display region NDA. The flexible circuit board may send an electrical signal to the display module DM to drive the display module DM. The electrical signal may be generated by the flexible circuit board or the main circuit board. The main circuit board may include various drive circuits for driving the display module DM, and/or a connector for connecting to a power supply. The main circuit board may be connected to the display module DM through the flexible circuit board.

The housing HU may be coupled with (e.g., connected or attached to) the window WM. In some embodiments, the housing HU is coupled to the window WM to form the exterior of the display device DD, and provides a suitable (e.g., predetermined) inner space. The display module DM may be accommodated in the inner space.

The housing HU may include a material with relatively high stiffness. For example, the housing HU may be made of glass, plastic, or metal, or include a plurality of frames and/or plates made of a combination thereof. The housing HU may reliably protect the components of the display device DD, which are accommodated in the inner space, from an external impact.

Figure 3:
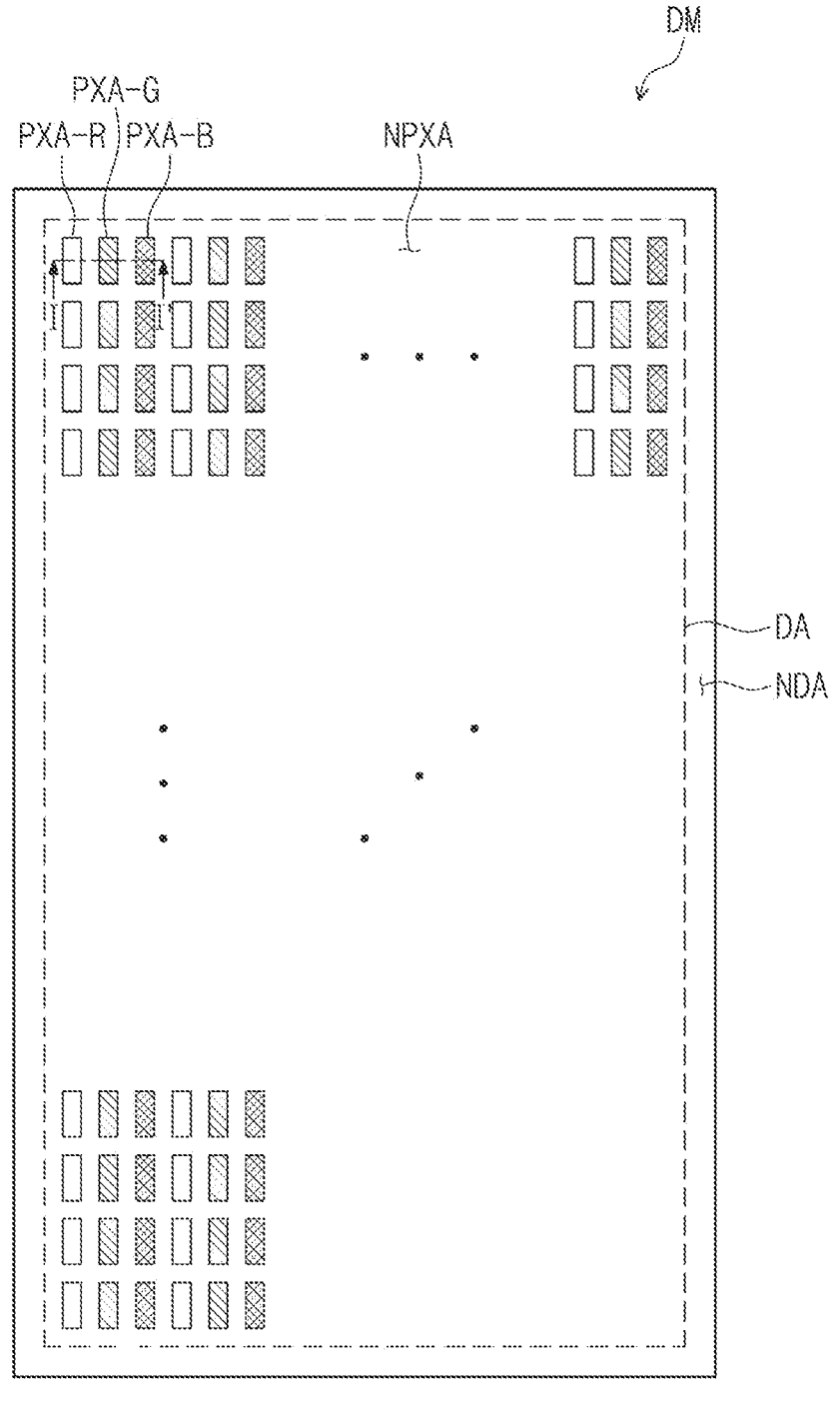
FIG. 3 is a plan view of a display module according to some embodiment of the present disclosure.
Figure 3:
Figure 4:
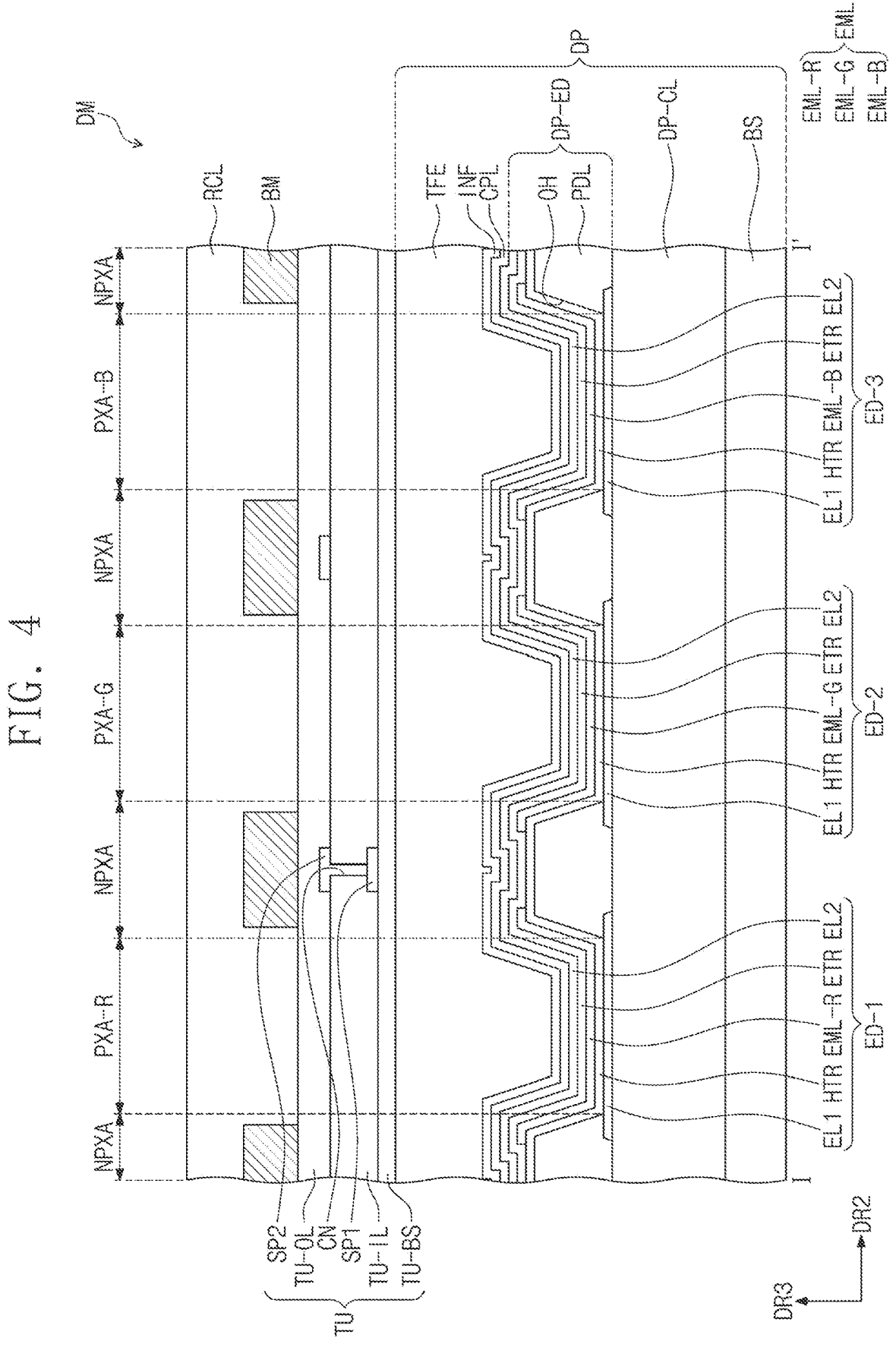
FIG. 4 is a cross-sectional view of a display module according to some embodiment of the present disclosure.

FIG. 3 is a plan view illustrating the display module according to some embodiments of the present disclosure. FIG. 4 is a cross-sectional view illustrating the display module according to some embodiments of the present disclosure. FIG. 4 is a cross-sectional view illustrating a portion of the display module taken along the line I-I' of FIG. 3.

Referring to FIG. 3 and FIG. 4, the display module DM may include a non-light-emitting region NPXA and light-emitting regions PXA-R, PXA-G, and PXA-B. Each of the light-emitting regions PXA-R, PXA-G, and PXA-B may be the regions from which light generated from each of light-emitting elements ED-1, ED-2, and ED-3 is emitted. The light-emitting regions PXA-R, PXA-G, and PXA-B may be spaced apart from each other on a plane (e.g., separated from each other in a plan view).

Each of the light-emitting regions PXA-R, PXA-G, and PXA-B may be separated by a pixel defining film PDL. The non-light-emitting region NPXA may be the region between the adjacent light-emitting regions PXA-R, PXA-G, and PXA-B, and correspond to the pixel defining film PDL. Each of the light-emitting regions PXA-R, PXA-G, and PXA-B may correspond to the respective pixels. The pixel defining film PDL may separate the light-emitting elements ED-1, ED-2, and ED-3. Each of a first, second, and third light-emitting layers EML-R, EML-G, and EML-B of the light-emitting elements ED-1, ED-2, and ED-3 may be separated by being disposed in an opening OH defined by the pixel defining film PDL.

The light-emitting regions PXA-R, PXA-G, and PXA-B may be divided into a plurality of groups according to the colors of the light generated from the light-emitting elements ED-1, ED-2, and ED-3. FIG. 3 and FIG. 4 exemplarily illustrate three light-emitting regions PXA-R, PXA-G, and PXA-B, which respectively emit red light, green light, and blue light, in the display module DM according to some embodiments. For example, the display module DM according to some embodiments may include a red light-emitting region PXA-R, a green light-emitting region PXA-G, and a blue light-emitting region PXA-B that are distinct from each other.

A plurality of light-emitting elements ED-1, ED-2, and ED-3 in the display module DM according to some embodiments emit light having different wavelength ranges. For example, in some embodiments, the display module DM includes a first light-emitting element ED-1 which emits red light, a second light-emitting element ED-2 which emits green light, and a third light-emitting element ED-3 which emits blue light. That is, the red light-emitting region PXA-R, the green light-emitting region PXA-G, and the blue light-emitting region PXA-B may correspond to the first light-emitting element ED-1, the second light-emitting element ED-2, and the third light-emitting element ED-3, respectively.

However, embodiments of the present disclosure are not limited thereto, and the first, second, and third light-emitting elements ED-1, ED-2, and ED-3 may emit light having the same wavelength range, or at least one light-emitting element may emit light having a different wavelength range.

For example, all of the first, second, and third light-emitting elements ED-1, ED-2, and ED-3 may emit blue light.

In the display module DM according to some embodiments, the light-emitting regions PXA-R, PXA-G, and PXA-B is arranged in a stripe pattern. Referring to FIG. 3, a plurality of red light-emitting regions PXA-R, a plurality of green light-emitting regions PXA-G, and a plurality of blue light-emitting regions PXA-B may be arranged along the first direction DR1. In addition, the red light-emitting region PXA-R, the green light-emitting region PXA-G, and the blue light-emitting region PXA-B may be arranged alternately along the second direction DR2 in the order stated. The light-emitting regions PXA-R, PXA-G, and PXA-B may be disposed in the display region DA, and not in the non-display region NDA.

In FIG. 3 and FIG. 4, the areas of the light-emitting regions PXA-R, PXA-G, and PXA-B appear to be similar. However, embodiments of the present disclosure are not limited thereto, and the areas of the light-emitting regions PXA-R, PXA-G, and PXA-B may be different from each other according to the wavelength range of the light emitted. As used herein, the areas of the light-emitting regions PXA-R, PXA-G, and PXA-B may be the areas observed on a plane defined by the first direction DR1 and the second direction DR2.

The arrangement of the light-emitting regions PXA-R, PXA-G, and PXA-B is not limited to the arrangement illustrated in FIG. 3, and the order in which the red light-emitting region PXA-R, the green light-emitting region PXA-G, and the blue light-emitting region PXA-B are arranged may be provided in various combinations according to the display quality characteristics of the display device DD (see FIG. 1). For example, the arrangement of the light-emitting regions PXA-R, PXA-G, and PXA-B may be the PENTILE™ arrangement, or the Diamond Pixel™ arrangement.

In addition, the areas of the light-emitting regions PXA-R, PXA-G, and PXA-B may be different from each other. For example, the area of the green light-emitting region PXA-G may be smaller than the area of the blue light-emitting region PXA-B in some embodiments. However, embodiments of the present disclosure are not limited thereto.

Referring to FIG. 4, the display module DM in some embodiments includes a display panel DP, a sensor layer TU, and a reflection adjustment layer RCL.

The display panel DP may be a configuration that substantially generates the image IM (see, e.g., FIG. 1). The image IM (see, e.g., FIG. 1) that is generated by the display panel DP may be viewed to a user from the outside through the transmission region TA (see, e.g., FIG. 1).

The display panel DP may include a plurality of pixels. The plurality of pixels may correspond to the plurality of light-emitting regions PXA-R, PXA-G, and PXA-B. The plurality of pixels may display light in response to electrical signals. The display region DA, due to the plurality of pixels ED-1, ED-2, and ED-3, may display the image IM (see, e.g., FIG. 1) which is generated by the light. The display panel DP according to some embodiments is a light-emitting display panel. For example, the display panel DP may be a micro LED display panel, a nano LED display panel, an organic light-emitting display panel, a quantum dot display panel, or the like. However, these are merely examples, and the light-emitting display panel is not limited thereto.

A light-emitting layer of the organic light-emitting display panel may include an organic light-emitting material. The light-emitting layer of the quantum dot light-emitting display panel may include quantum dots and/or quantum rods.

The micro LED display panel may include a micro light-emitting diode element which is an ultra-small light-emitting element, and the nano LED display panel may include a nano light-emitting diode element. Hereinafter, the display panel DP is described as the organic light-emitting display panel.

The display panel DP may include a base layer BS, a circuit layer DP-CL, and a light-emitting element layer DP-ED. In addition, the display panel DP may include an inorganic absorption layer INF disposed on the light-emitting element layer DP-ED, and an encapsulation layer TFE, and may further include a capping layer CPL between the light-emitting element layer DP-ED and the inorganic absorption layer INF.

The base layer BS may be a member for providing a base surface on which the circuit layer DP-CL is disposed. The base layer BS may be a rigid substrate, or a flexible substrate capable of bending, folding, rolling, or the like. The base layer BS may be a glass substrate, a metal substrate, a polymer substrate, or the like. However, embodiments of the present disclosure are not limited thereto, and the base layer BS may be an inorganic layer, an organic layer, or a composite material layer. For example, the base layer BS may include an organic layer formed of polyimide.

The base layer BS may have a multi-layer structure. For example, the base layer BS may have a first synthetic resin layer, an intermediate layer having a multi-layer or single-layer structure, and a second synthetic resin layer disposed on the intermediate layer. The intermediate layer may be referred to as a base barrier layer. The intermediate layer may include a silicon oxide ($SiO_x$) layer and an amorphous silicon (a-Si) layer disposed on the silicon oxide layer. However, embodiments of the present disclosure are not limited thereto. For example, the intermediate layer may include at least one of a silicon oxide layer, a silicon nitride layer, a silicon oxynitride layer, or an amorphous silicon layer.

The first and the second synthetic resin layers may each include a polyimide-based resin. In addition, each of the first and the second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Herein, the wording "~~"-based resin may be considered as including a functional group of "~~". The polyimide-based resin may be a transparent polyimide-based resin.

The circuit layer DP-CL may be disposed on the base layer BS. The circuit layer DP-CL may include an insulation layer, a semiconductor pattern, a conductive pattern, a signal line, and the like. The insulation layer, a semiconductor layer, and a conductive layer may be formed on the base layer BS through coating, deposition, etc., and may be then selectively patterned by performing a photolithography process one or more times. As a result, the semiconductor pattern, the conductive pattern, and the signal line, which are included in the circuit layer DP-CL, may be formed.

The light-emitting element layer DP-ED may be disposed on the circuit layer DP-CL. The light-emitting element layer DP-ED may include the light-emitting elements ED-1, ED-2, and ED-3. Each of the light-emitting elements ED-1, ED-2, and ED-3 may include a first electrode EL1, a hole transport region HTR, a light-emitting layer EML, an electron transport region ETR, and a second electrode EL2.

The first electrode EL1 may be disposed on the circuit layer DP-CL. The first electrode EL1 may be a transmissive electrode, a transflective electrode, or a reflective electrode. The first electrode EL1 may include at least one of Ag, Mg, Cu, Al, Pt, Pd, Au, Ni, Nd, Ir, Cr, Li, Ca, LiF, Mo, Ti, W, In, Sn, or Zn, a compound or a mixture including two or more selected therefrom, or an oxide thereof.

When the first electrode EL1 is a transmissive electrode, the first electrode EL1 may include a transparent metal oxide such as indium tin oxide (ITO), indium zinc oxide (IZO), zinc oxide (ZnO), indium tin zinc oxide (ITZO), or the like. When the first electrode EL1 is a transflective electrode or reflective electrode, the first electrode EL1 may include Ag, Mg, Cu, Al, Pt, Pd, Au, Ni, Nd, Ir, Cr, Li, Ca, LiF/Ca (i.e., a stacked structure of LiF and Ca), LiF/Al (i.e., a stacked structure of LiF and Al), Mo, Ti, W, or a compound or mixture (e.g., a mixture of Ag and Mg) thereof. The first electrode EL1 may also have a multi-layer structure including a reflective film or a transflective film including the above-mentioned materials, and a transparent conductive film including indium tin oxide (ITO), indium zinc oxide (IZO), zinc oxide (ZnO), indium tin zinc oxide (ITZO), and/or the like. For example, the first electrode EL1 may have a three-layer structure of ITO/Ag/ITO; however, embodiments of the present disclosure are not limited thereto.

The hole transport region HTR is provided on the first electrode EL1. The hole transport region HTR may be provided as a common layer (e.g., as a layer extending continuously between the light-emitting elements ED-1, ED-2, and ED-3). The hole transport region HTR may be a single layer made of a single material, or a single layer made of a plurality of materials different from each other, or may have a multi-layer structure including a plurality of layers made of a plurality of materials different from each other. The hole transport region HTR may include at least one of a hole injection layer, a hole transport layer, a buffer layer or a light-emitting auxiliary layer, or an electron blocking layer. In addition, the hole transport region, although not illustrated, may include a plurality of stacked hole transport layers.

The light-emitting layer EML is provided on the hole transport region HTR. The light-emitting layer EML may include first, second, and third light-emitting layers EML-R, EML-G, and EML-B, which may be provided in a suitable pattern. For example, the first light emitting layer EML-R may be disposed corresponding to (e.g., located in) the red light-emitting region PXA-R, a second light-emitting layer EML-G may be disposed corresponding to (e.g., located in) the green light-emitting region PXA-G, and a third light-emitting layer EML-B may be disposed corresponding to (e.g., located in) the blue light-emitting region PXA-B. The light-emitting layer EML may have a thickness of, for example, about 100 Å to about 1000 Å, or a thickness of about 100 Å to about 300 Å. The light emitting layer EML may be a single layer made of a single material, or a single layer made of a plurality of materials different from each other, or may have a multi-layer structure including a plurality of layers made of a plurality of materials different from each other.

In some embodiments, the electron transport region ETR is provided on the light-emitting layer EML. The electron transport region ETR may include at least one of a hole blocking layer, an electron transport layer, or an electron injection layer. However, embodiments of the present disclosure are not limited thereto. The electron transport region ETR may be provided as a common layer in the non-light-emitting region NPXA and the light-emitting regions PXA-R, PXA-G, and PXA-B (e.g., the electron transport region ETR may extend continuously between the light-emitting elements ED-1, ED-2, and ED-3). The electron transport region ETR may be a single layer made of a single material or a single layer made of a plurality of materials different from each other, or may have a multi-layer structure including a plurality of layers made of a plurality of materials different from each other.

The pixel defining film PDL may be disposed on the circuit layer DP-CL. The pixel defining film PDL may separate the light-emitting elements ED-1, ED-2, and ED-3. The pixel defining film PDL may include the same material, and may be formed through the same process. The pixel defining film PDL may have a light-absorbing property. For example, the pixel defining film PDL may have black color. The pixel defining film PDL may include a black coloring agent. The black coloring agent may include a black dye and/or a black pigment. The black coloring agent may include carbon black, metal such as chrome, or an oxide thereof. The pixel defining film may correspond to a light-blocking pattern having a light-blocking characteristic.

The pixel defining film PDL may cover a portion of the first electrode EL1 of each of the light-emitting elements ED-1, ED-2, and ED-3. For example, the opening OH exposing a portion of the first electrode EL1 of each of the light-emitting elements ED-1, ED-2, and ED-3 may be defined by the pixel defining film PDL.

FIG. 4 illustrates embodiments in which the first, second, and third light-emitting layers EML-R, EML-G, and EML-B of the light-emitting elements ED-1, ED-2, and ED-3 may overlap the opening OH defined in the pixel defining film PDL and may be provided in a pattern on the circuit layer DP-CL, and the hole transport region HTR, the electron transport region ETR, and the second electrode EL2 may each be provided as a common layer throughout the light-emitting elements ED-1, ED-2, and ED-3. However, embodiments of the present disclosure are not limited thereto, and in some embodiments, the hole transport region HTR and the electron transport region ETR, unlike the one illustrated in FIG. 4, are pattered inside the opening OH defined in the pixel defining film PDL. For example, the hole transport region HTR, the light-emitting layer EML, and the electron transport region ETR of the light-emitting elements ED-1, ED-2, and ED-3 may be provided by being patterned through an inkjet printing.

The encapsulation layer TFE may be disposed on the light-emitting element layer DP-ED. The encapsulation layer TFE may protect the light-emitting element layer DP-ED from foreign substance such as moisture, oxygen, dust particles, and/or the like. The encapsulation layer TFE may be a thin-film encapsulation layer. The encapsulation layer TFE may include at least one insulation layer. The encapsulation layer TFE may be provided by stacking a plurality of layers. The encapsulation layer TFE according to some embodiments includes at least one inorganic layer. In some embodiments, the encapsulation layer TFE includes at least one organic layer and at least one inorganic layer. The encapsulation layer TFE may be described in further detail with reference to FIGS. 5A through 5C below.

The inorganic absorption layer INF may be disposed between the light-emitting element layer DP-ED and the encapsulation layer TFE, and may be disposed directly on (e.g., may be contacting) the capping layer CPL. In examples in which the capping layer CPL is omitted from the display panel DP, the inorganic absorption layer INF may be disposed directly on (e.g., may be contacting) the light-emitting element layer DP-ED.

The inorganic absorption layer INF may have a function of decreasing reflected light generated by the second electrode EL2 included in the light-emitting element layer DP-ED or another metal layer. The inorganic absorption layer INF may induce destructive interference between the reflected light that is reflected from the second electrode EL2, etc., and directed to the upper side of the encapsulation layer TFE, and the reflected light that is reflected from the inorganic absorption layer INF and directed to the upper side of the encapsulation layer TFE, thereby achieving the low reflection characteristic of the display panel DP.

The inorganic absorption layer INF may include one metal or an alloy of a plurality of metals. The inorganic absorption layer INF may have a refractive index (n) of about 1 or more. For example, the inorganic absorption layer INF may have a refractive index (n) of about 1.8 to about 3.0. In addition, the inorganic absorption layer INF may have an extinction coefficient (k) of about 2 or less. For example, the inorganic absorption layer INF may have an extinction coefficient (k) of about 0.5 to about 2.0.

The inorganic absorption layer INF may include a transition metal, a post-transition metal, a lanthanum metal, or an alloy of two or more selected therefrom. For example, the inorganic absorption layer INF may include bismuth (Bi), a Bi-containing alloy, ytterbium (Yb), a Yb-containing alloy, manganese (Mn), or a Mn-containing alloy. The inorganic absorption layer INF may be provided on the second electrode EL2 through vacuum deposition.

The display panel DP according to some embodiments further includes the capping layer CPL disposed between the light-emitting element layer DP-ED and the inorganic absorption layer INF. The capping layer CPL according to some embodiments are disposed directly on (e.g., are in contact with) the light-emitting element layer DP-ED, and may serve as a common layer throughout the non-light-emitting region NPXA and the light-emitting regions PXA-R, PXA-G, and PXA-B.

In some embodiments, the capping layer CPL includes an organic layer and/or an inorganic layer. For example, when the capping layer CPL includes an inorganic substance, the inorganic substance may be an alkali metal compound of LiF and the like, an alkali earth metal compound of $MgF_2$ and the like, or SiON, $SiN_x$, $SiO_y$, and the like.

For example, when the capping layer CPL includes an organic substance, the organic substance may be α-NPD, NPB, TPD, m-MTDATA, Alq3, CuPc, TPD15 (N4,N4,N4', N4'-tetra (biphenyl-4-yl) biphenyl-4,4'-diamine), TCTA(4, 4',4"-Tris (carbazol-9-yl) triphenylamine), and the like, or an epoxy resin or an acrylate, such as methacrylate.

The sensor layer TU may be disposed on the display panel DP. The sensor layer TU may detect an external input applied from the outside. The external input may be a user input. The user input may include various types of external inputs such as from a part of the user's body (e.g., a user's finger), light, heat, a pen, pressure, or the like.

In the display panel DP according to some embodiments, the sensor layer TU is formed on the display panel DP through a continuous process. In such embodiments, the sensor layer TU may be disposed directly on the display panel DP. That is, any separate adhesive member may not be disposed between the sensor layer TU and the display panel DP. In some embodiments, the sensor layer TU is coupled to (e.g., attached or adhered to) the display panel DP by an adhesive member. The adhesive member may be a suitable adhesive or gluing agent.

In some embodiments, the sensor layer TU includes a sensor base layer TU-BS, a first conductive layer SP1, an inorganic insulation layer TU-IL, a second conductive layer SP2, and an organic insulation layer TU-OL. The first conductive layer SP1 may be disposed on (e.g., contact) the sensor base layer TU-BS. The inorganic insulation layer TU-IL may cover the first conductive layer SP1, and may be disposed on the sensor base layer TU-BS and the first conductive layer SP1. The second conductive layer SP2 may be disposed on the inorganic insulation layer TU-IL. The organic insulation layer TU-OL may cover the second conductive layer SP2, and may be disposed on (e.g., contact) the inorganic insulation layer TU-IL and the second conductive layer SP2.

The sensor base layer TU-BS may be an inorganic layer containing at least one of silicon nitride, silicon oxynitride, or silicon oxide. In some examples, the sensor base layer TU-BS may be an organic layer including an epoxy resin, an acrylate resin, and/or an imide-based resin. The sensor base layer TU-BS may have a single-layer structure or a multi-layer structure in which layers are stacked along the third direction DR3.

Each of the first conductive layer SP1 and the second conductive layer SP2 may have a single-layer structure or a multi-layer structure in which layers are stacked along the third direction DR3. The single-layered conductive layers SP1 and SP2 may each be a metal layer or a transparent conductive layer. The metal layer may include molybdenum, silver, titanium, copper, aluminum, or an alloy thereof. The transparent conductive layer may contain a transparent conductive oxide such as indium tin oxide (ITO), indium zinc oxide (IZO), zinc oxide (ZnO), and indium zinc tin oxide (IZTO). In addition, the transparent conductive layer may include a conductive polymer such as PEDOT, a metallic nanowire, graphene, and/or the like.

The multi-layered conductive layers SP1 and SP2 may each include metal layers. The metal layers may have a three-layered structure of, for example, titanium (Ti)/aluminum (Al)/titanium (Ti). The multi-layered conductive layers SP1 and SP2 may each include at least one metal layer and at least one transparent conductive layer.

The inorganic insulation layer TU-IL may include at least one of aluminum oxide, titanium oxide, silicon oxide, silicon oxynitride, zirconium oxide, or hafnium oxide.

The inorganic insulation layer TU-IL may have a contact hole CN defined therein. The first conductive layer SP1 and the second conductive layer SP2 may be electrically connected to each other through the contact hole CN. The contact hole CN may be filled with the material of the second conductive layer SP2. FIG. 4 illustrates only one contact hole CN being defined in the inorganic insulation layer TU-IL. However, embodiments of the present disclosure are not limited thereto, and a plurality of contact holes may be defined in the inorganic insulation layer.

The organic insulation layer TU-OL may cover the inorganic insulation layer TU-IL and the second conductive layer SP2. The organic insulation layer TU-OL may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The reflection adjustment layer RCL may be disposed on the sensor layer TU. The reflection adjustment layer RCL may reduce the reflectance caused by the external light incident from the outside. In addition, the reflection adjustment layer RCL may be used together with the inorganic absorption layer INF to serve as an anti-reflection member. That is, the reflection adjustment layer RCL may be used together with the inorganic absorption layer INF to reduce the reflected light that is reflected from the metal layers included in the display panel DP. For example, the reflection adjustment layer RCL may be used together with the inorganic absorption layer INF to reduce the reflected light that is reflected from the second electrode EL2, etc. of the light-emitting elements ED-1, ED-2, and ED-3.

The reflection adjustment layer RCL may be formed on the sensor layer TU by a continuous process. For example, the reflection adjustment layer RCL may be provided on the sensor layer TU through inkjet printing.

In some embodiments, the display module DM further includes a partition portion BM disposed on the sensor layer TU and covered by the reflection adjustment layer RCL. The partition portion BM may overlap the non-light-emitting region NPXA, and may be spaced apart from each other. The partition portion BM may prevent light leakage phenomenon. The partition portion BM may be a light-blocking member. The partition portion BM may include an organic light-blocking material, a black dye, a black pigment, and/or the like. When the display module DM according to some embodiments includes the partition portion BM, the reflection adjustment layer RCL fills a gap between partition portions BM that are spaced apart from each other (e.g., that are offset from one another in the second direction DR2).

Figure 5A:
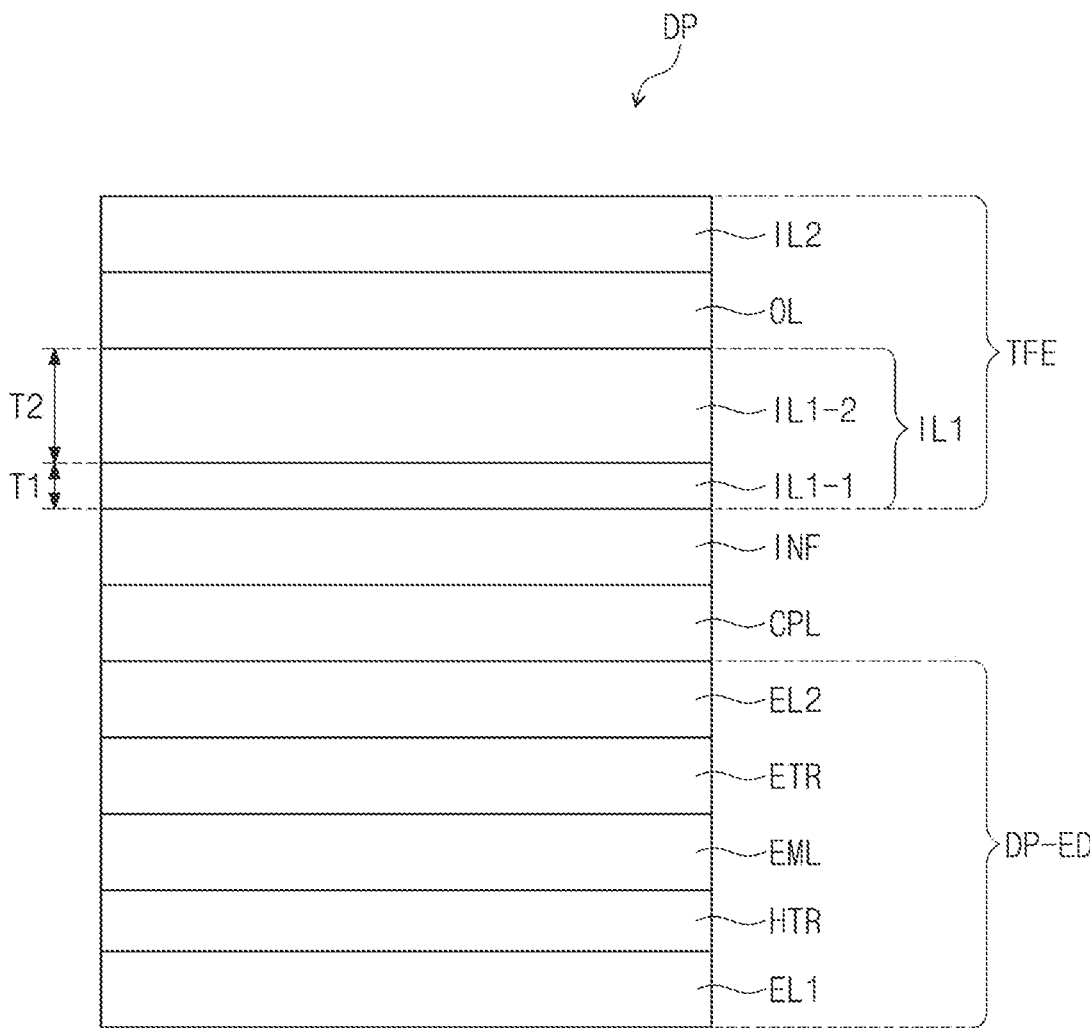
FIGS. 5A-5C are enlarged cross-sectional views each illustrating a portion of a display panel, according to some embodiments of the present disclosure.
Figure 5A:
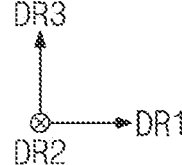
Figure 5B:
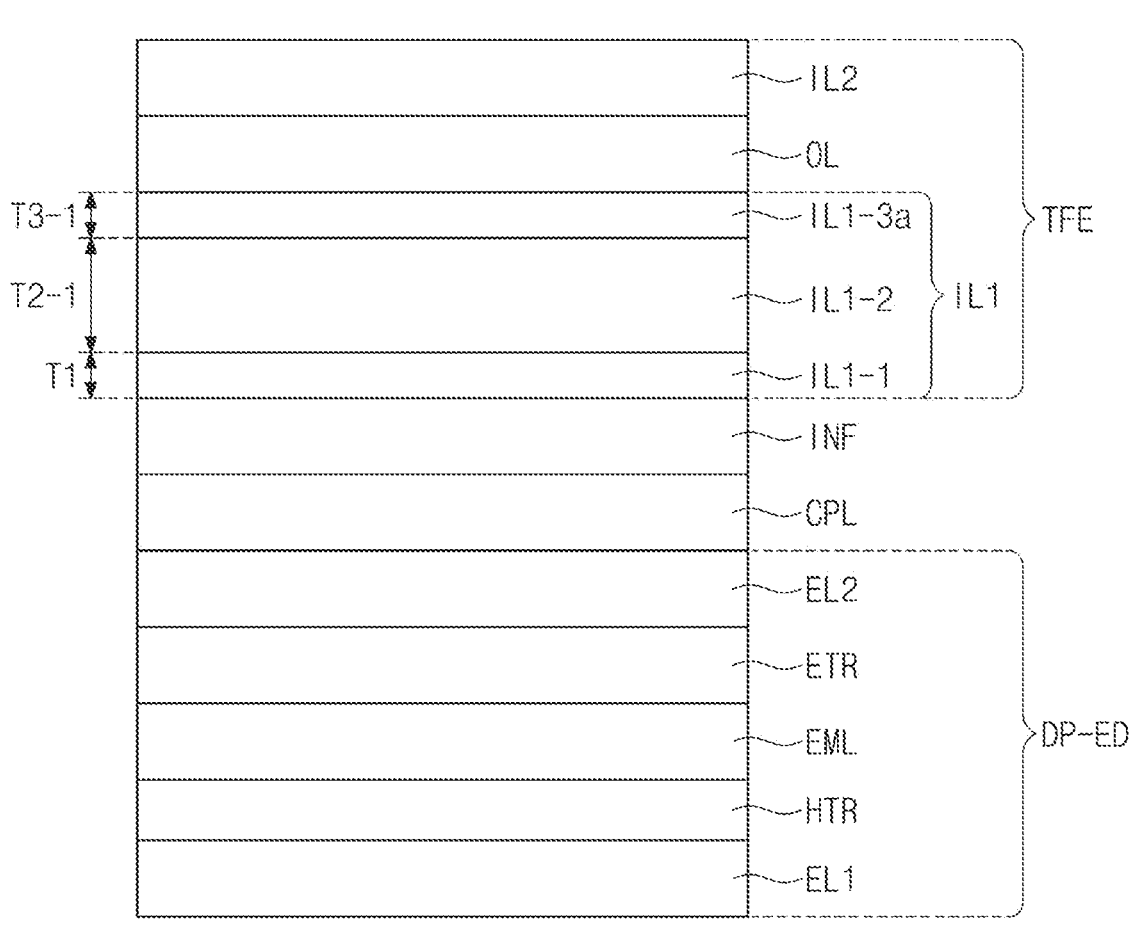
Figure 5B:
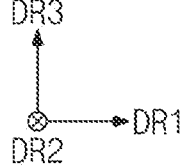
Figure 5C:
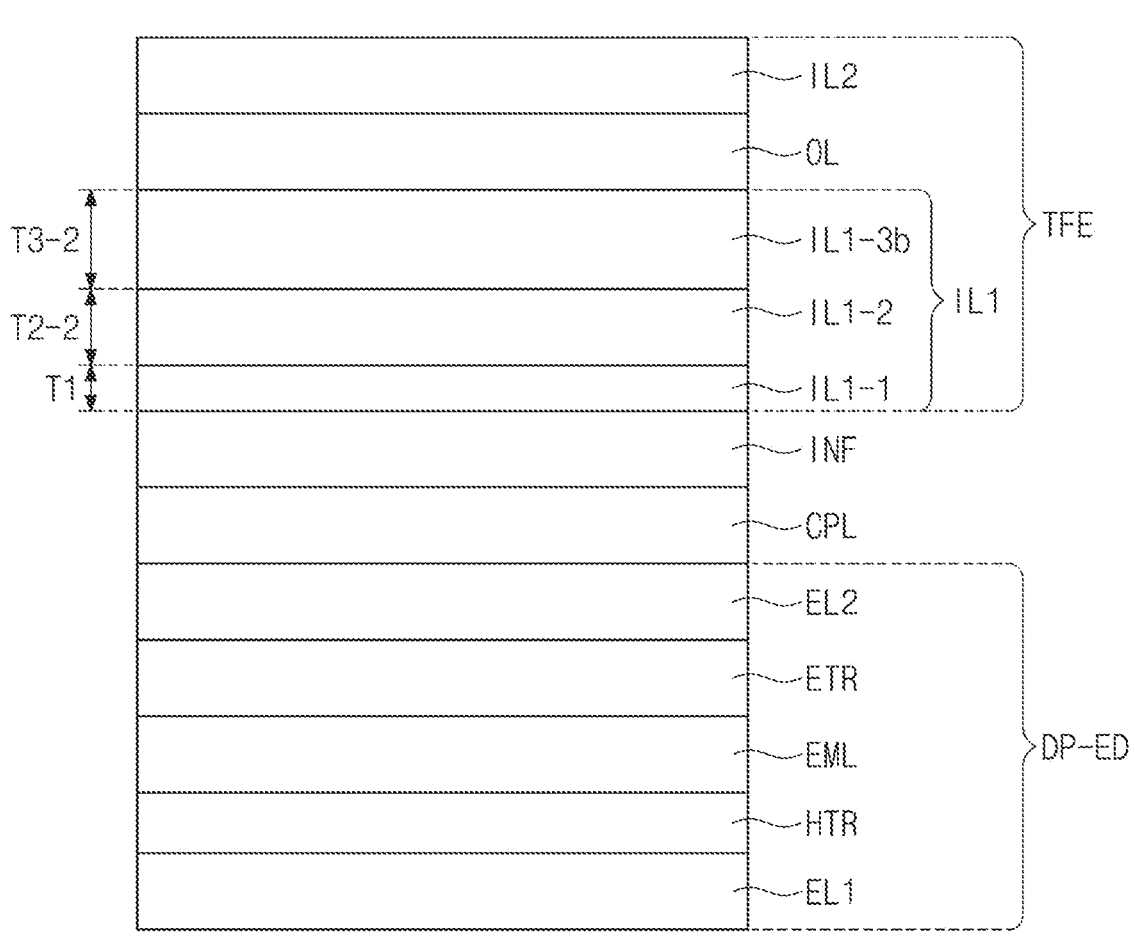

FIGS. 5A through 5C are enlarged cross-sectional views each illustrating a portion of the display panel. In FIGS. 5A through 5C, the configuration of the light-emitting element layer, the capping layer, the inorganic absorption layer, and the encapsulation layer is illustrated while the configuration of the circuit layer and the base layer is omitted from the display panel of FIG. 4 for ease of illustration.

Hereinafter, in describing the embodiments of FIGS. 5A through 5C, the description of common elements with those of the embodiments of FIGS. 1 through 4 may not be repeated, and the description herein may mainly focus on the differences between the embodiments of FIGS. 5A-5C and those of FIG. 4.

As illustrated in FIGS. 5A through 5C, the display panel DP according to some embodiments includes a light-emitting element layer DP-ED, a capping layer CPL disposed on the light-emitting element layer DP-ED, an inorganic absorption layer INF disposed on the capping layer CPL, and an encapsulation layer TFE disposed on the inorganic absorption layer INF. The encapsulation layer TFE according to the embodiments illustrated in FIG. 4 may have the structure illustrated in FIGS. 5A through 5C. However, this is illustrated by way of example, and embodiments of the present disclosure are not limited thereto.

Referring to FIGS. 5A through 5C, the encapsulation layer TFE according to some embodiments includes a first layer IL1, a second layer OL, and a third layer IL2. In the encapsulation layer TFE according to some embodiments, the first layer IL1 and the third layer IL2 are inorganic layers, and the second layer OL is an organic layer. The first layer IL1 may be a first inorganic layer disposed on (e.g., directly on) the inorganic absorption layer INF. The second layer OL may be an organic layer disposed on the first layer IL1, and the third layer IL2 may be a second inorganic layer disposed on the second layer OL. That is, the encapsulation layer TFE may include two inorganic layers and one organic layer. The first layer IL1, the second layer OL, and the third layer IL2 may be sequentially stacked along the third direction. For example, the first layer IL1 may be disposed directly on the inorganic absorption layer INF, the second layer OL may be disposed directly on the first layer IL1, and the third layer IL2 may be disposed directly on the second layer OL.

The first layer IL1 and the third layer IL2 may protect the light-emitting element layer DP-ED from moisture/oxygen, and the second layer OL may protect the light-emitting element layer DP-ED from foreign substances, such as dust particles. Each of the first layer IL1 and the third layer IL2 may include silicon oxynitride, silicon nitride, silicon oxide, titanium oxide, aluminum oxide, and/or the like. For example, the first layer IL1 may include silicon oxynitride ($SiO_xN_y$), and the third layer IL2 may include silicon nitride ($SiN_x$). The second layer OL may include acrylate-based compound, epoxy-based compound, and the like. The second layer OL may include a photopolymerizable organic material, but is not limited particularly thereto.

In some embodiments, the first layer IL1 of the encapsulation layer TFE may include a first sub layer IL1-1 and a second sub layer IL1-2, and may further include a third sub layer IL1-3a or IL1-3b (see, e.g., FIGS. 5B and 5C). Each of the first sub layer IL1-1, the second sub layer IL1-2, and the third sub layer IL1-3a or IL1-3b may be an inorganic layer including silicon oxynitride ($SiO_xN_y$). In addition, each of the first sub layer IL1-1, the second sub layer IL1-2, and the third sub layer IL1-3a or IL1-3b may be a refractive layer having a particular refractive index according to the values of x and y of the silicon oxynitride ($SiO_xN_y$), that is, the oxygen and nitrogen contents of silicon oxynitride ($SiO_xN_y$), or may be a layer having no refractive index (e.g., may have a refractive index of about 0) by adjusting the contents of nitrogen and oxygen in SiOxNy. In some embodiments, each of the first sub layer IL1-1, the second sub layer IL1-2, and the third sub layer IL1-3a or IL1-3b has a refractive index which increases as the nitrogen content of silicon oxynitride ($SiO_xN_y$) increases, and decreases as the nitrogen content of silicon oxynitride ($SiO_xN_y$) decreases.

Herein, the first sub layer IL1-1, the second sub layer IL1-2, and the third sub layer IL1-3a or IL1-3b may also be referred to as a first sub inorganic layer, a second sub inorganic layer, and a third sub inorganic layer, respectively. Hereinafter, the first sub layer IL1-1, the second sub layer IL1-2, and the third sub layer IL1-3a or IL1-3b are denoted using the same reference numerals or symbols as the first sub inorganic layer, the second sub inorganic layer, and the third sub inorganic layer, respectively.

Referring to FIG. 5A, the first layer IL1 of the encapsulation layer TFE according to some embodiments includes the first sub layer IL1-1 and the second sub layer IL1-2. In some embodiments, the first sub layer IL1-1 of the first layer IL1 is disposed on the inorganic absorption layer INF, which is disposed on the light-emitting element layer DP-ED. The first sub layer IL1-1 may be disposed on (e.g., be directly on) the top surface of the inorganic absorption layer INF. The second sub layer IL1-2 may be disposed on the first sub layer IL1-1. The second sub layer IL1-2 may be disposed on (e.g., be directly on) the top surface of the first sub layer IL1-1.

The first sub layer IL1-1 may have a refractive index of about 1.62 or more. In some embodiments, when the display panel DP includes the first sub layer IL1-1, the higher the refractive index of the first sub layer IL1-1, the more the luminous efficiency (i.e., light extraction efficiency) increases. In this respect, the first sub layer IL1-1 may have a first refractive index of about 1.77 or more. For example, the first sub layer IL1-1 may have a first refractive index of about 1.77 or about 1.89 in the wavelength range of about 550 nm. However, this is illustrated by way of example, and embodiments of the present disclosure are not limited thereto.

In some embodiments, the second sub layer IL1-2 has a second refractive index lower than the first refractive index of the first sub layer IL1-1. The second sub layer IL1-2 may have a second refractive index of about 1.5 or less. For example, the second refractive index may be about 1.5 or about 1.48 in the wavelength range of about 550 nm. However, this is illustrated by way of example, and embodiments of the present disclosure are not limited thereto. As illustrated in FIG. 5A, when the first layer IL1 according to some embodiments includes the first sub layer IL1-1 and the second sub layer IL1-2, the higher the first refractive index of the first sub layer IL1-1 is than the second refractive index of the second sub layer IL1-2, the greater the luminous efficiency the display panel DP may be.

In some embodiments, the encapsulation layer TFE includes the first sub layer IL1-1 having a relatively high refractive index and the second sub layer IL1-2 having a relatively low refractive index, and may thus contribute to preventing the decrease in luminous efficiency of the light-emitting elements ED-1, ED-2, and ED-3 (see, e.g., FIG. 3), due to the inorganic absorption layer INF introduced in the display panel DP. For example, the inorganic absorption layer INF, introduced in the display panel DP, may affect the resonance phenomenon that occurs inside the light-emitting elements ED-1, ED-2, and ED-3 (see, e.g., FIG. 3) to decrease the efficiency. However, the display panel DP according to some embodiments of the present disclosure has improved luminous efficiency by including the first sub layer IL1-1, which is a high refractive layer, and the second sub layer IL1-2, which is a low refractive layer.

In some embodiments, the first sub layer IL1-1 may include silicon oxynitride ($SiO_xN_y$) the nitrogen content of which may be higher than that of the second sub layer IL1-2. This may make the first refractive index of the first sub layer IL1-1 higher than the second refractive index of the second sub layer IL1-2. For example, when the first refractive index is about 1.77, the value x of the silicon oxynitride ($SiO_xN_y$) may be about 0.27, and the value y may be about 0.65; when the first refractive index is about 1.89, the value x of the silicon oxynitride ($SiO_xN_y$) may be about 0, and the value y may be about 0.72; and when the second refractive index is about 1.48, the value x of the silicon oxynitride ($SiO_xN_y$) may be about 1.20, and the value y may be about 0.25. However, this is illustrated by way of example, and embodiments of the present disclosure are not limited thereto. In some embodiments, a nitrogen content in silicon oxynitride ($SiO_xN_y$) may be higher than an oxygen content in the first sub layer IL1-1, compared to the case in the second sub layer IL1-2.

In the first layer IL1 according to some embodiments, the first sub layer IL1-1 may have a first thickness T1, and the second sub layer IL1-2 may have a second thickness T2. The first thickness T1 may be less than the second thickness T2. That is, the second sub layer IL1-2 may have a thickness greater than the first sub layer IL1-1. For example, the first thickness T1 of the first sub layer IL1-1 may be about 500 Å to about 600 Å, or about 1500 Å to 1750 Å. In addition, the second thickness T2 of the second sub layer IL1-2 may be about 7000 Å to about 10000 Å. In some examples, the second thickness T2 of the second sub layer IL1-2 may be about 9000 Å. However, embodiments of the present disclosure are not limited thereto, and the thickness of the second sub layer IL1-2 may be adjusted to about 800 Å to about 2000 Å according to the refractive index of the capping layer CPL and/or the refractive index, thickness, and the like of the third sub layer IL1-3$a$ or IL1-3$b$ introduced in the first layer IL1.

Referring to FIG. 5B and FIG. 5C, in the encapsulation layer TFE according to some embodiments, the first layer IL1 includes the first sub layer IL1-1, the second sub layer IL1-2, and the third sub layer IL1-3$a$ or IL1-3$b$. In the first layer IL1 according to some embodiments, the first sub layer IL1-1 is disposed on the inorganic absorption layer INF, the second sub layer IL1-2 is disposed on the first sub layer IL1-1, and the third sub layer IL1-3$a$ or IL1-3$b$ is disposed on the second sub layer IL1-2. The third sub layer IL1-3$a$ or IL1-3$b$ may be disposed on (e.g., directly on) the top surface of the second sub layer IL1-2.

In some embodiments, the third sub layer IL1-3$a$ or IL1-3$b$ has a refractive index which is lower than that of the first sub layer IL1-1, or higher than that of the second sub layer IL1-2. That is, the third sub layer IL1-3$a$ or IL1-3$b$ may have a third refractive index lower than the first refractive index of the first sub layer IL1-1, or have a fourth refractive index higher than the second refractive index of the second sub layer IL1-2.

Referring to FIG. 5B, in some embodiments, the third sub layer IL1-3$a$ has a refractive index lower than that of the first sub layer IL1-1. In some embodiments, the third sub layer IL1-3$a$ has the third refractive index lower than the first refractive index of the first sub layer IL1-1. The third refractive index of the third sub layer IL1-3$a$ may be lower than the first refractive index of about 1.77 or more. The third sub layer IL1-3$a$ may have a third refractive index of about 1.70 or less. For example, the third sub layer IL1-3$a$ may have a third refractive index of about 1.70, about 1.62, or about 0 in the wavelength range of about 550 nm. In addition, the third refractive index of the third sub layer IL1-3$a$ may be about 0 in the wavelength range of about 550 nm. However, embodiments of the present disclosure are not limited thereto.

In some embodiments, the third sub layer IL1-3$a$ having the third refractive index includes silicon oxynitride (Si-$O_xN_y$) the nitrogen content of which is lower than that of the first sub layer IL1-1 having the first refractive index. For example, when the third refractive index of the third sub layer IL1-3$a$ is about 1.62, the value x of the silicon oxynitride ($SiO_xN_y$), contained in the third sub layer IL-3$a$, may be about 0.68, and the value y may be about 0.47. In this case, the value y of the silicon oxynitride ($SiO_xN_y$) contained in the first sub layer IL1-1 may be greater than about 0.47. However, this is illustrated by way of example, and embodiments of the present disclosure are not limited thereto.

In some embodiments, when the third sub layer IL1-3$a$ has a third refractive index of about 1.70 or less, the first sub layer IL1-1 has a first thickness T1 of about 500 Å to about 600 Å, the second sub layer IL1-2 has a (2-1)-th thickness T2-1 of about 7000 Å to about 10000 Å, and the third sub layer IL1-3$a$ may have a (3-1)-th thickness T3-1 of about 550 Å to about 750 Å. In some embodiments, when the first sub layer IL1-1, the second sub layer IL1-2, and the third sub layer IL1-3$a$ have the first refractive index, the second refractive index, and the third refractive index, respectively, and have the thickness ranges as described above, the display panel according to some embodiments may have a further improved efficiency (e.g., luminous/light extraction efficiency).

Referring to FIG. 5C, the first layer IL1 according to some embodiments includes the third sub layer IL1-3$b$ on the first sub layer IL1-1 and the second sub layer IL1-2 in order to enhance reliability. In some embodiments, the third sub layer IL1-3$b$ has a refractive index higher than that of the second sub layer IL1-2. In some embodiments, the third sub layer IL1-3$b$ has a fourth refractive index higher than the second refractive index of the second sub layer IL1-2. The fourth refractive index of the third sub layer IL1-3$b$ may be about 1.65 or more. For example, the third sub layer IL1-3$b$ may have a fourth refractive index of about 1.77 or about 1.89 in the wavelength range of about 550 nm. However, embodiments of the present disclosure are not limited thereto.

In some embodiments, the third sub layer IL1-3$b$ having the fourth refractive index includes the silicon oxynitride ($SiO_xN_y$) the nitrogen content of which is higher than that of the second sub layer IL1-2 having the second refractive index. In some embodiments, when the third sub layer IL1-3$b$ has a fourth refractive index of about 1.77, the value x of the silicon oxynitride ($SiO_xN_y$) contained in the third sub layer IL1-3$b$ may be about 0.27, and the value y may be about 0.65. In this case, the value y of the silicon oxynitride ($SiO_xN_y$) contained in the second sub layer IL1-2 may be less than about 0.65. When the third sub layer IL1-3$b$ has a fourth refractive index of about 1.89, the value x of the silicon oxynitride ($SiO_xN_y$) contained in the third sub layer IL1-3$b$ may be about 0, and the value y may be about 0.72. In this case, the value y of the silicon oxynitride ($SiO_xN_y$) contained in the second sub layer IL1-2 may be less than 0.72. However, this is illustrated by way of example, and embodiments of the present disclosure are not limited thereto.

In some embodiments, when the third sub layer IL1-3$b$ has a fourth refractive index of about 1.65 or more, the third sub layer IL1-3$b$ may have a (3-2)-th thickness T3-2 of about 7000 Å to about 10000 Å. When the third sub layer IL1-3$b$ according to some embodiments has the (3-2)-th thickness T3-2, the second sub layer IL1-2 may be a thin film. In some embodiments, the first layer IL1 may include the first sub layer IL1-1 and the second sub layer IL1-2 which are relatively thin films, and the third sub layer IL1-3$b$ which is a thick film. For example, the first sub layer IL1-1 may have the first thickness T1 of about 500 Å to about 600 Å, the second sub layer IL1-2 may have a (2-2)-th thickness T2-2 of about 800 Å to about 2000 Å, and the third sub layer IL1-3$a$ may have a (3-2)-th thickness T3-2 of about 7000 Å to about 10000 Å. That is, when the third sub layer IL1-3$b$ has a large thickness of about 7000 Å to about 10000 Å, the second sub layer IL1-2 may have the (2-2)-th thickness T2-2 smaller than the (2-1)-th thickness T2-1. In some embodiments, when the first sub layer IL1-1, the second sub layer IL1-2, and the third sub layer IL1-3$b$ have the first refractive index, the second refractive index, and the third refractive index, respectively, and have the first thickness T1, the (2-2)-th thickness T2-2, and the (3-2)-th thickness T3-2, respectively, the display panel according to some embodiments may have improved efficiency (e.g., luminous/light extraction efficiency).

Referring to FIGS. 5A and 5C, when the display panel DP according to some embodiments has the first sub layer IL1-1 and the second sub layer IL1-2, and the second sub layer has a second thickness T2 of about 7000 Å to about 10000 Å, the display panel DP may have improved efficiency by adjusting the refractive indexes of the capping layer CPL and the inorganic absorption layer INF. In addition, in the display panel DP according to some embodiments, when the first layer IL1 includes the first sub layer IL1-1, the second sub layer IL1-2, and the third sub layer IL1-3$b$, and the third sub layer IL1-3$b$ has the (3-2)-th thickness T3-2, the display panel DP according to some embodiments may have improved efficiency by adjusting the refractive indexes of the capping layer CPL and the inorganic absorption layer INF. In some embodiment, the efficiency of the display panel DP may be improved under the condition that the refractive index of the capping layer CPL increases and the refractive index of the inorganic absorption layer INF decreases. In some embodiment, the inorganic absorption layer INF may have a refractive index of about 1.8 to about 3.0, and the capping layer CPL may have a refractive index higher than the above-described refractive index (n) of the inorganic absorption layer INF. For example, the refractive index of the capping layer CPL may be about 1.97 or about 2.05, and the refractive index of the inorganic absorption layer INF may be about 1.9 or about 2.4. In some embodiments, under the condition that the refractive index of the inorganic absorption layer INF is constant, the higher the refractive index of the capping layer CPL, the more improved efficiency the display panel DP may have. In addition, the greater the difference between the refractive index of the capping layer CPL and the refractive index of the inorganic absorption layer INF, the more improved efficiency the display panel DP may have. In some embodiments, the difference between the refractive index of the capping layer and the refractive index of the inorganic absorption layer may be about 0.15 or more. However, embodiments of the present disclosure are not limited thereto.

Figure 6A:
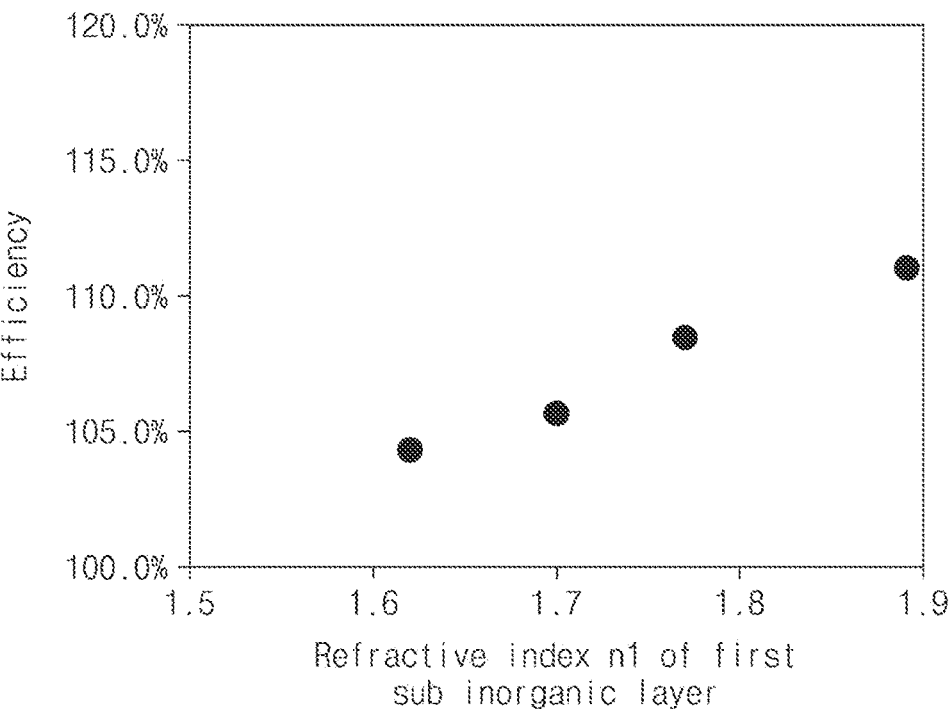
FIG. 6A is a graph showing the efficiency versus the change in the refractive index of a first sub inorganic layer according to some embodiments of the present disclosure.
Figure 6B:
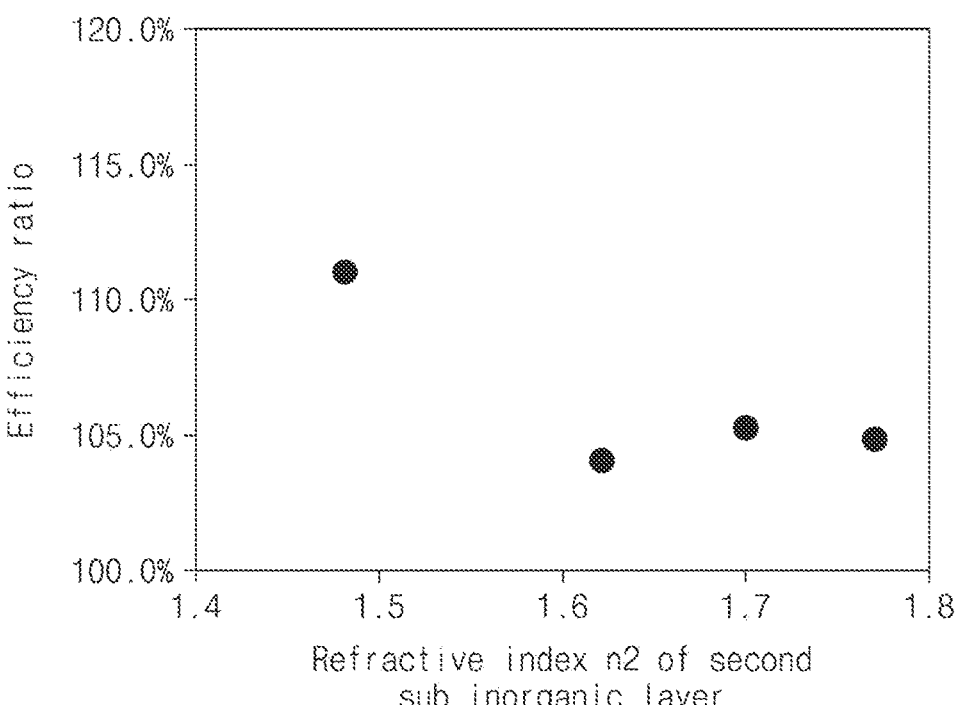
FIG. 6B is a graph showing the efficiency versus the change in the refractive index of a second sub inorganic layer according to some embodiments of the present disclosure.
Figure 6C:
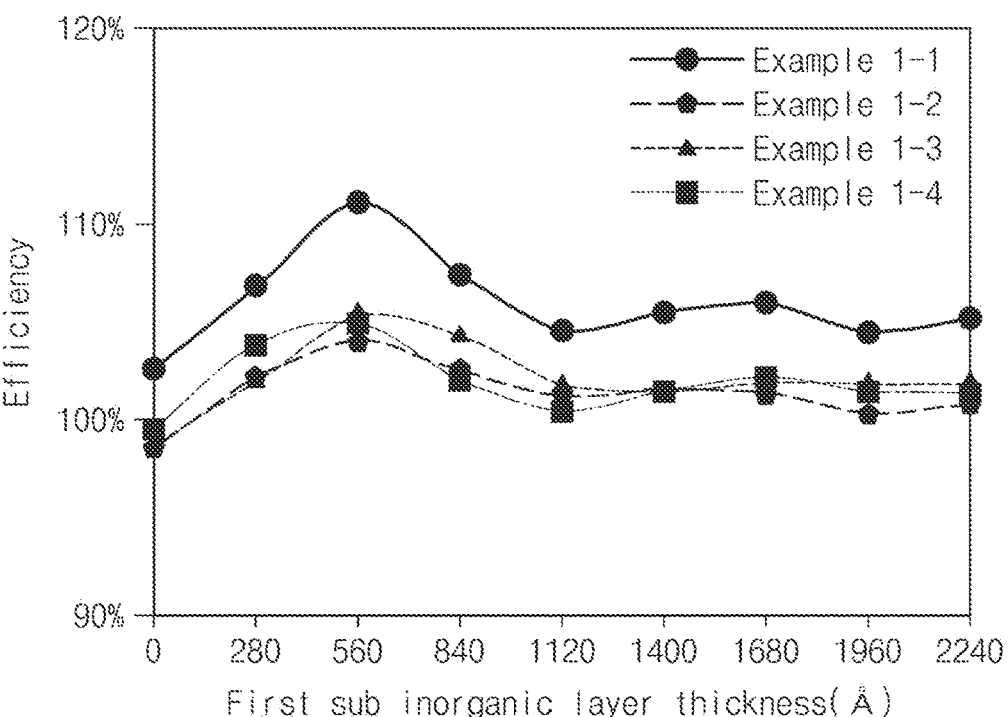
FIG. 6C is a graph showing the efficiency versus the change in the thickness of a first sub inorganic layer according to some embodiments of the present disclosure.
Figure 6D:
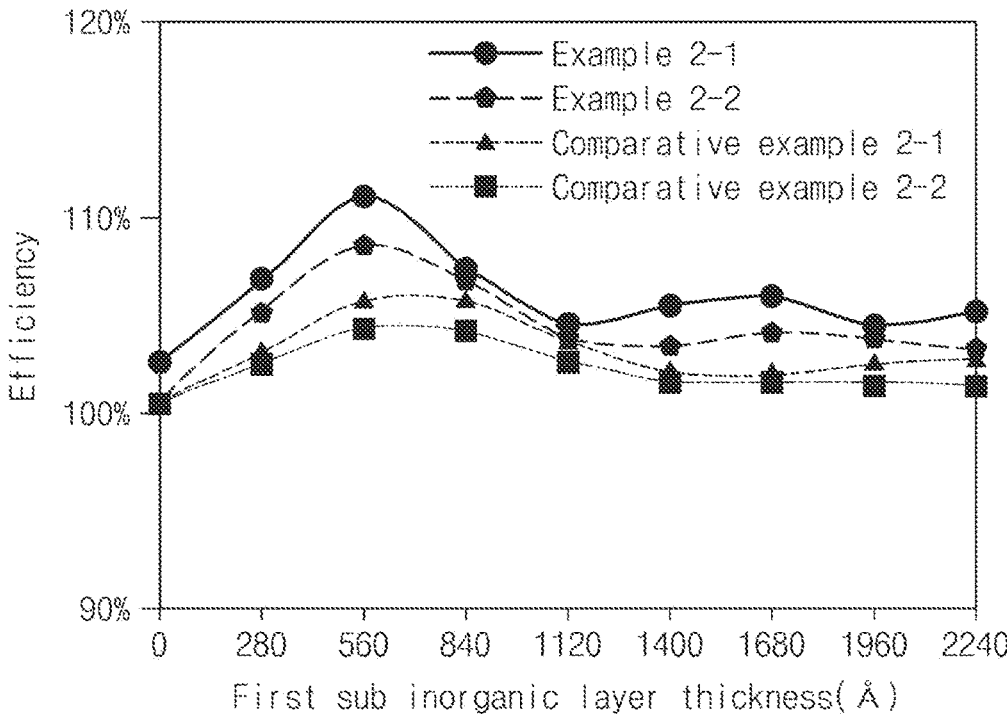
FIG. 6D is a graph showing the efficiency versus the change in the thickness of a second sub inorganic layer according to some embodiments of the present disclosure.

FIG. 6A is a graph showing the efficiency (e.g., the luminous efficiency) versus the change of the refractive index of the first sub inorganic layer according to some embodiments of the present disclosure. FIG. 6B is a graph showing the efficiency (e.g., the luminous efficiency) versus the change of the refractive index of the second sub inorganic layer according to some embodiments of the present disclosure. FIG. 6C is a graph showing the efficiency (e.g., the luminous efficiency) versus the change of the thickness of the first sub inorganic layer according to some embodiments of the present disclosure. FIG. 6D is a graph showing the efficiency (e.g., the luminous efficiency) versus the change of the thickness of the second sub inorganic layer according to some embodiments of the present disclosure.

Referring to FIG. 6A, it may be seen that the refractive index of the first sub inorganic layer IL1-1 is about 1.62 or more and the efficiency increases as the refractive index of the first sub inorganic layer IL1-1 increases. That is, in the display panel DP including the first sub layer IL1-1 according to some embodiments, the higher the refractive index of the first sub layer IL1-1, the more improved the luminous efficiency may be. For example, it may be seen that the display panel DP according to some embodiment may have a high efficiency of about 110% or more when the refractive index of the first sub layer IL1-1 is about 1.77 or more. Referring to FIG. 6B, it may be seen that the second sub layer IL1-2 has good efficiency when the refractive index thereof is lower than the first refractive index which is about 1.77 or more, and particularly, it may be seen that the high efficiency of 110% is exhibited when the refractive index is about 1.5 or less.

Table 1 below shows the white efficiency ratio, the red efficiency ratio, the green efficiency ratio, and the blue efficiency ratio in Examples and Comparative Examples having a structure of the display panel of FIG. 5A or 5C. In Table 1, each of Comparative Example 1-a, Comparative Example 1-b, and Example 1-a has a structure of the display panel of FIG. 5A, in which the capping layer has a refractive index of about 2.05, the inorganic absorption layer has a refractive index of about 2.4, and the first sub layer and the second sub layer have refractive indexes and thicknesses as shown in Table 1 below. In addition, each of Examples 1-c and 1-d has a structure of the display panel of FIG. 5C, in which the capping layer has a refractive index of about 2.05, the inorganic absorption layer has a refractive index of about 1.9, and the first, second, and third sub layers have refractive indexes and thicknesses, respectively, as shown in Table 1 below. Each of Examples 1-e through 1-f has a structure of the display panel of FIG. 5C, in which the capping layer has a refractive index of about 1.97, the inorganic absorption layer has a refractive index of about 1.9, and the first, second, and third sub layers have refractive indexes and thicknesses as shown in Table 1 below.

TABLE 1

| Classification | Condition of first layer IL1 of encapsulation layer TFE | | | Red efficiency ratio | Green efficiency ratio | Blue efficiency ratio | White efficiency ratio |
|---|---|---|---|---|---|---|---|
| | Refractive index (thickness) of first sublayer | Refractive index (thickness) of second sublayer | Refractive index (thickness) of third sublayer | | | | |
| Comparative Example 1-a | 1.77 (11000 Å) | 1.62 (700 Å) | — | 100.0% | 100.0% | 100.0% | 100.0% |
| Comparative Example 1-b | 1.89 (11000 Å) | 1.70 (700 Å) | — | 100.6% | 105.6% | 108.2% | 105.4% |
| Example 1-a | 1.89 (560 Å) | 1.48 (9000 Å) | — | 114.0% | 114.1% | 121.3% | 116.6% |
| Example 1-b | 1.89 (560 Å) | 1.48 (840 Å) | 1.89 (9000 Å) | 119.3% | 116.1% | 109.2% | 113.2% |
| Example 1-c | 1.89 (560 Å) | 1.48 (840 Å) | 1.89 (9000 Å) | 123.7% | 126.6% | 118.9% | 122.1% |
| Example 1-d | 1.89 (560 Å) | 1.48 (840 Å) | 1.77 (9000 Å) | 116.5% | 122.6% | 121.3% | 120.1% |
| Example 1-e | 1.89 (560 Å) | 1.48 (840 Å) | 1.89 (9000 Å) | 121.2% | 105.4% | 107.8% | 110.2% |
| Example 1-f | 1.89 (560 Å) | 1.48 (1960 Å) | 1.89 (9000 Å) | 103.0% | 114.4% | 121.3% | 115.0% |
| Example 1-g | 1.89 (560 Å) | 1.48 (840 Å) | 1.77 (9000 Å) | 113.5% | 119.8% | 109.0% | 113.3% |

Referring to Table 1, it may be seen that Examples 1-a through 1-g have higher efficiency than Comparative Examples 1-a and 1-b. The results of Examples 1-b through 1-g may demonstrate that the efficiency increases as the refractive index of the capping layer becomes higher, and the refractive index of the inorganic absorption layer becomes lower.

FIG. 6C shows the efficiency (e.g., the luminous efficiency) of the display panel versus the thickness of the first sub inorganic layer in a state in which, in a display panel configuration according to the embodiments illustrated in FIG. 5A, the refractive index of the second sub inorganic layer is changed to about 1.89, and the thickness of the second sub inorganic layer is changed to about 9000 Å, while the refractive index of the first sub inorganic layer is fixed. FIG. 6D shows the efficiency (e.g., the luminous efficiency) of the display panel versus the thickness of the first sub inorganic layer in a state in which, in a display panel configuration according to the embodiments illustrated in FIG. 5A, the refractive index of the first sub inorganic layer is changed to about 1.48, and the thickness of the second sub inorganic layer is changed to about 9000 Å, while the refractive index of the second sub inorganic layer is fixed. In FIGS. 6C and 6D, each efficiency is the result of calculation on the basis of 100% efficiency when the display panel has a structure in which the first sub inorganic layer has a refractive index of about 1.77 and a thickness of about 11000 Å, and the second sub inorganic layer has a refractive index of about 1.62 and a thickness of about 700 Å.

In FIG. 6C, the refractive indexes of the second sub inorganic layer IL1-2 according to Examples 1-2, 1-3, and 1-4 are about 1.48, about 1.62, about 1.70, and about 1.77, respectively. In FIG. 6D, the refractive indexes of the first sub inorganic layer IL1-1 according to Examples 2-1, 2-2, Comparative Examples 2-1, and 2-2 are about 1.89, about 1.77, about 1.70, and about 1.62, respectively.

Referring to FIG. 6C, it may be seen that Example 1-1, in which the second sub inorganic layer IL1-2 has a refractive index of about 1.48, has higher overall efficiency across all the thicknesses of the first sub inorganic layer IL1-1 than Example 1-2 (the refractive index of the second sub inorganic layer is about 1.62), Example 1-3 (the refractive index of the second sub inorganic layer is about 1.70), and Example 1-4 (the refractive index of the second sub inorganic layer is about 1.77). From this result, it may be seen that the display panel according to some embodiments in which the first sub inorganic layer IL1-1 has a refractive index of about 1.77 or more has high efficiency when the second sub inorganic layer IL1-2 has a refractive index of about 1.44 or less. In particular, it may be seen that Example 1-1 has a high efficiency of about 110% or more when the first sub inorganic layer IL1-1 has a thickness of about 500 Å to about 600 Å. In Example 1-1, the efficiency changes relatively rapidly when the first sub inorganic layer IL1-1 has a thickness in the range of about 500 Å to about 600 Å, which may be due to the increase in inter-cell characteristic distribution caused by the deviation of a film thickness up and down during the process. The first sub inorganic layer IL1-1 according to some embodiments may have a thickness of about 1500 Å to about 1750 Å, with which an high efficiency of about 105% or more is exhibited and the efficiency changes gradually (e.g., exhibits little change) with variations in thickness within the stated range.

That is, in the display panel DP according to some embodiments, when each of the first sub inorganic layer IL1-1 and the second sub inorganic layer IL1-2 has a refractive index in a suitable range (e.g., predetermined range), the first sub inorganic layer IL1-1 may have a thickness of about 500 Å to about 600 Å, or about 1500 Å to about 1750 Å, which allows for improved efficiency.

Referring to FIG. 6D, it may be seen that Example 2-1 in which the first sub inorganic layer IL1-1 has a refractive index of about 1.89 and Example 2-2 in which the first sub inorganic layer IL1-1 has a refractive index of about 1.77 may have greater efficiency overall than Comparative Example 2-1 (in which the refractive index of the first sub inorganic layer is about 1.70) and Comparative Example 2-2 (in which the refractive index of the first sub inorganic layer is about 1.62). In particular, it may be seen that Examples 2-1 and 2-2 have a high efficiency of about 110% or more when the first sub inorganic layer IL1-1 has a thickness of about 500 Å to about 600 Å. In addition, it may be seen that Examples 2-1 and 2-2 have a high efficiency of about 105% or more, and the characteristic distribution does not increase relatively (e.g., does not vary by much) when the first sub inorganic layer IL1-1 has a thickness of about 1500 Å to about 1750 Å.

Accordingly, it may be seen that when the encapsulation layer TFE includes the first sub layer IL1-1 and the second sub layer IL1-2, the display panel DP has improved efficiency when the refractive index of the first sub layer IL1-1 is about 1.77 or more, the thickness thereof is about 500 Å to about 600 Å or about 1500 Å to about 1750 Å, and the refractive index of the second sub layer IL1-2 is about 1.50 or less.

Figure 7A:
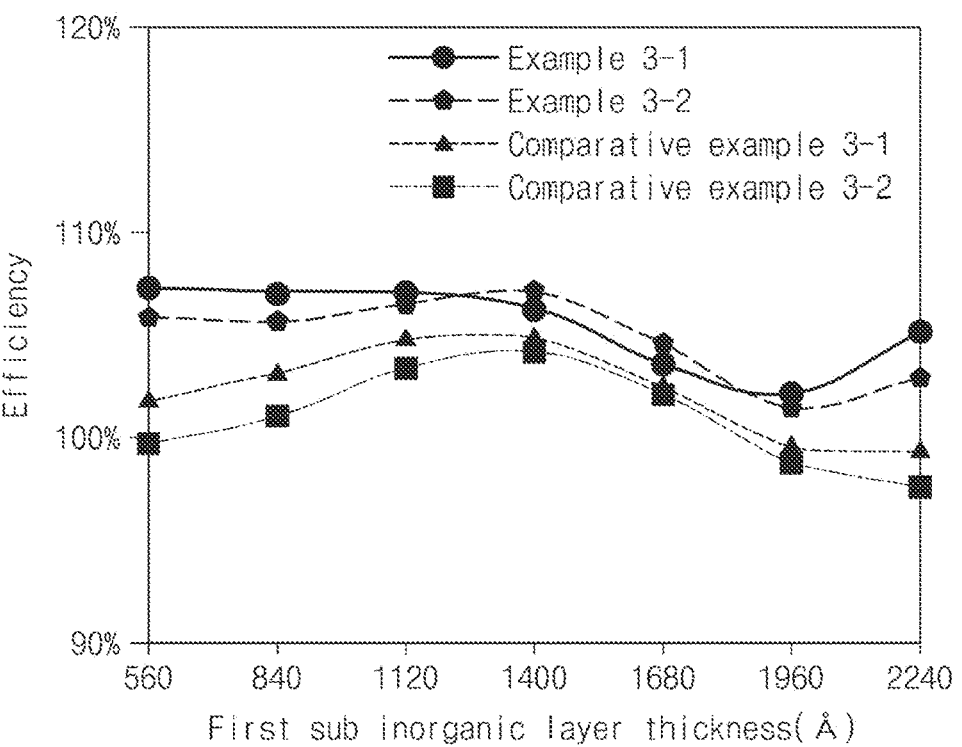
FIGS. 7A-7C are graphs respectively showing the efficiency versus the changes in refractive indexes of first, second, and third sub inorganic layers according to some embodiments of the present disclosure.
Figure 7B:
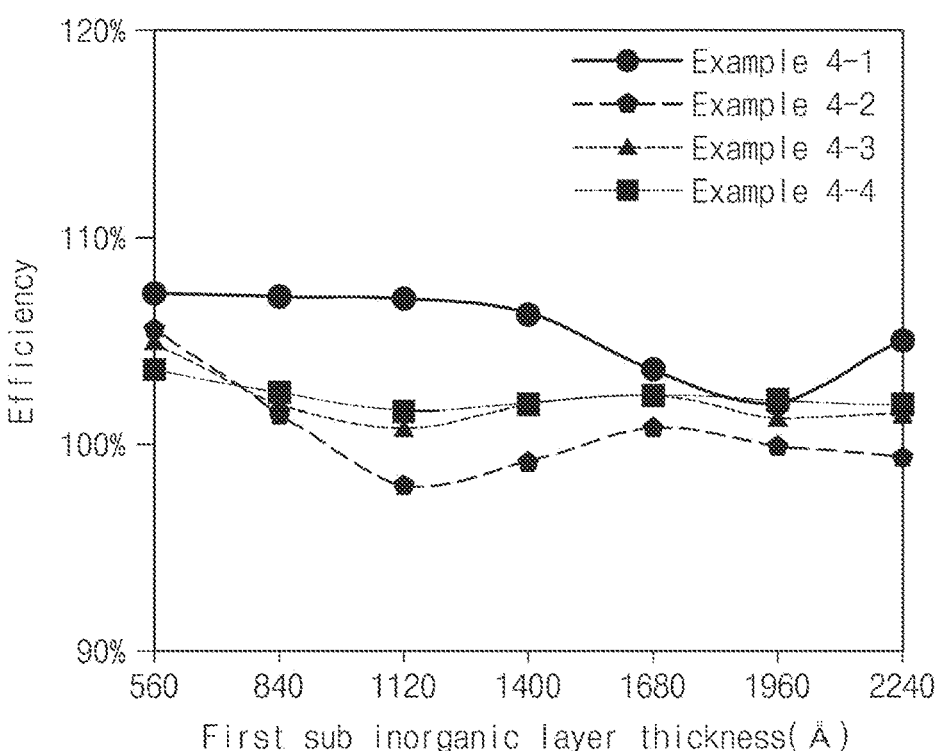
Figure 7C:
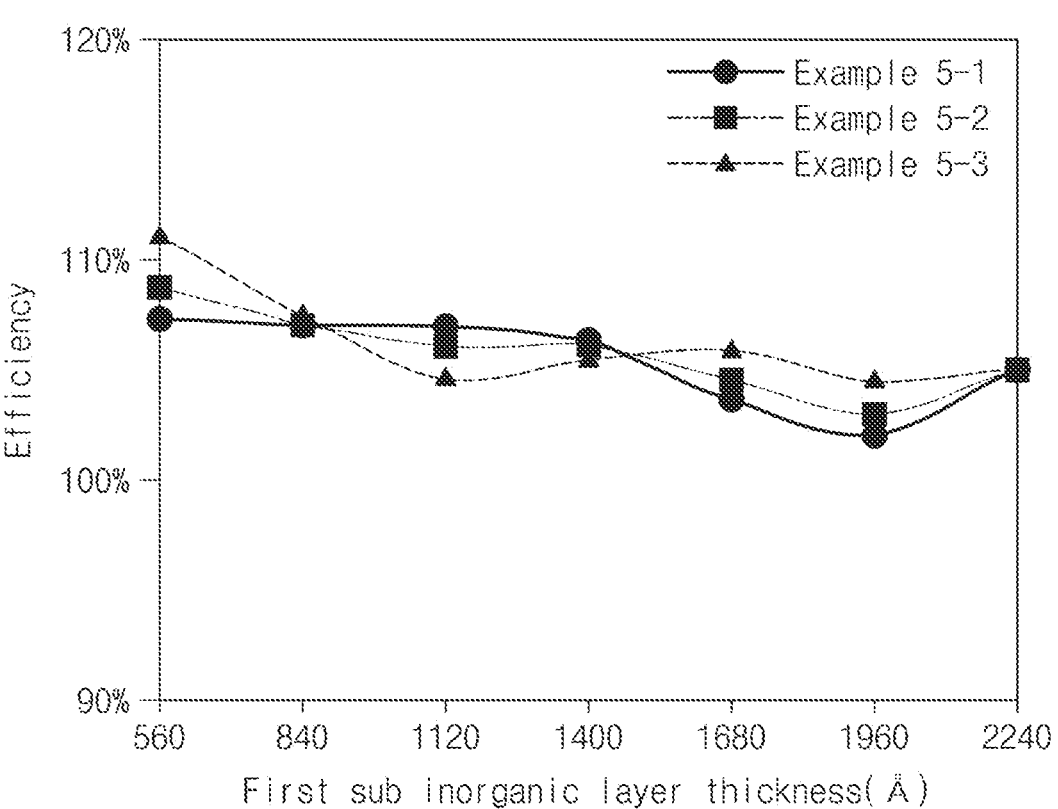

FIGS. 7A through 7C are graphs respectively showing the efficiency (e.g., luminous efficiency) versus the change in refractive indexes of first, second, and third sub inorganic layers according to some embodiments of the present disclosure. FIG. 7A is a graph showing the efficiency versus the change in refractive index of the first sub inorganic layer in the display panel according to some embodiments of FIG. 5B. FIG. 7B is a graph showing, in the display panel according to some embodiments of FIG. 5B, the efficiency versus the change in refractive index of the second sub inorganic layer of some embodiments. FIG. 7C is a graph showing the efficiency versus the change in refractive index of the third sub inorganic layer in the display panel according to some embodiments of FIG. 5B. In FIGS. 7A through 7C, the second sub inorganic layer has a thickness of about 9000 Å, and the third sub inorganic layer has a thickness of about 650 Å.

In FIG. 7A, the refractive indexes of the first sub inorganic layer IL1-1 in Examples 3-1 and 3-2, and Comparative Examples 3-1 and 3-2 are about 1.89, about 1.77, about 1.70, and about 1.62, respectively, the refractive index of the second sub inorganic layer IL1-2 is about 1.48, and the refractive index of the third sub inorganic layer IL1-3a is about 1.70. In FIG. 7B, the refractive indexes of the second sub inorganic layer IL1-2 in Examples 4-1, 4-2, 4-3, and 4-4 are about 1.48, about 1.62, about 1.70, and about 1.77, respectively, the refractive index of the first sub inorganic layer IL1-1 is about 1.89, and the refractive index of the third sub inorganic layer IL1-3a is about 1.70. In FIG. 7C, the refractive indexes of the third sub inorganic layer IL1-3a in Examples 5-1, 5-2, and 5-3 are about 1.70, about 1.62, and about 0, respectively, the refractive index of the first sub inorganic layer IL1-1 is about 1.89, and the refractive index of the second sub inorganic layer IL1-2 is about 1.40.

Referring to FIG. 7A, it may be seen that when the first sub inorganic layer IL1-1 has a refractive index higher than the refractive index of the second sub inorganic layer IL1-2 which is about 1.48, the efficiency is good. It may be seen that both of Example 3-1, in which the refractive index of the first sub inorganic layer IL1-1 is about 1.89, and Example 3-2, in which the refractive index of the first sub inorganic layer IL1-1 is about 1.77, have greater efficiency than Comparative Example 3-1, in which the refractive index of the first sub inorganic layer IL1-1 is about 1.70, or Comparative Example 3-2 in which the refractive index of the first sub inorganic layer IL1-1 is about 1.62. In this case, it may be seen that the display panel DP according to some embodiments has high efficiency when the first sub inorganic layer IL1-1 has a first thickness T1 of about 500 Å to about 600 Å. For example, it may be seen that compared to Comparative Examples 3-1 and 3-2, Examples 3-1 and 3-2 have remarkably high efficiency when the first sub inorganic layer IL1-1 has a thickness of about 560 Å.

Referring to FIG. 7B, it may be seen that the display panel DP according to some embodiments has good efficiency when the second sub inorganic layer IL1-2 has a refractive index lower than that of the first sub inorganic layer IL1-1. It may be seen that Example 4-1 in which the second sub inorganic layer IL1-2 has a refractive index of about 1.48 has greater efficiency than Examples 4-2, 4-3, and 4-4 in which the second sub inorganic layer IL1-2 has refractive indexes of about 1.62, about 1.70, or about 1.77, respectively. In addition, it may be seen that Example 4-1 may have more improved efficiency when the first sub inorganic layer IL1-1 has the first thickness T1 of about 500 Å to about 600 Å, for example, a thickness of about 560 Å.

Referring to FIG. 7C, it may be seen that when the first sub inorganic layer IL1-1 has a refractive index of about 1.77 or more, and the second sub inorganic layer IL1-2 has a refractive index of about 1.5 or less, the lower the refractive index of the third sub inorganic layer IL1-3a is, the greater the efficiency of the display panel DP may be. It may be seen that when the first sub inorganic layer IL1-1 has a first thickness T1 of about 500 Å to about 600 Å, for example, about 560 Å, Example 5-3 in which the third sub inorganic layer IL1-3a has a refractive index of about 0 has greater efficiency than Examples 5-2 and 5-3 in which the third sub inorganic layer IL1-3a has refractive indexes of about 1.70 and about 1.62, respectively.

Referring to FIGS. 7A through 7C together, the display panel DP according to some embodiments may include the first sub inorganic layer/the second sub inorganic layer/the third sub inorganic layer, which respectively correspond to the high refractive layer/low refractive layer/low refractive layer, and are stacked in sequence on the inorganic absorption layer INF, thereby achieving improved luminous efficiency.

Figure 8A:
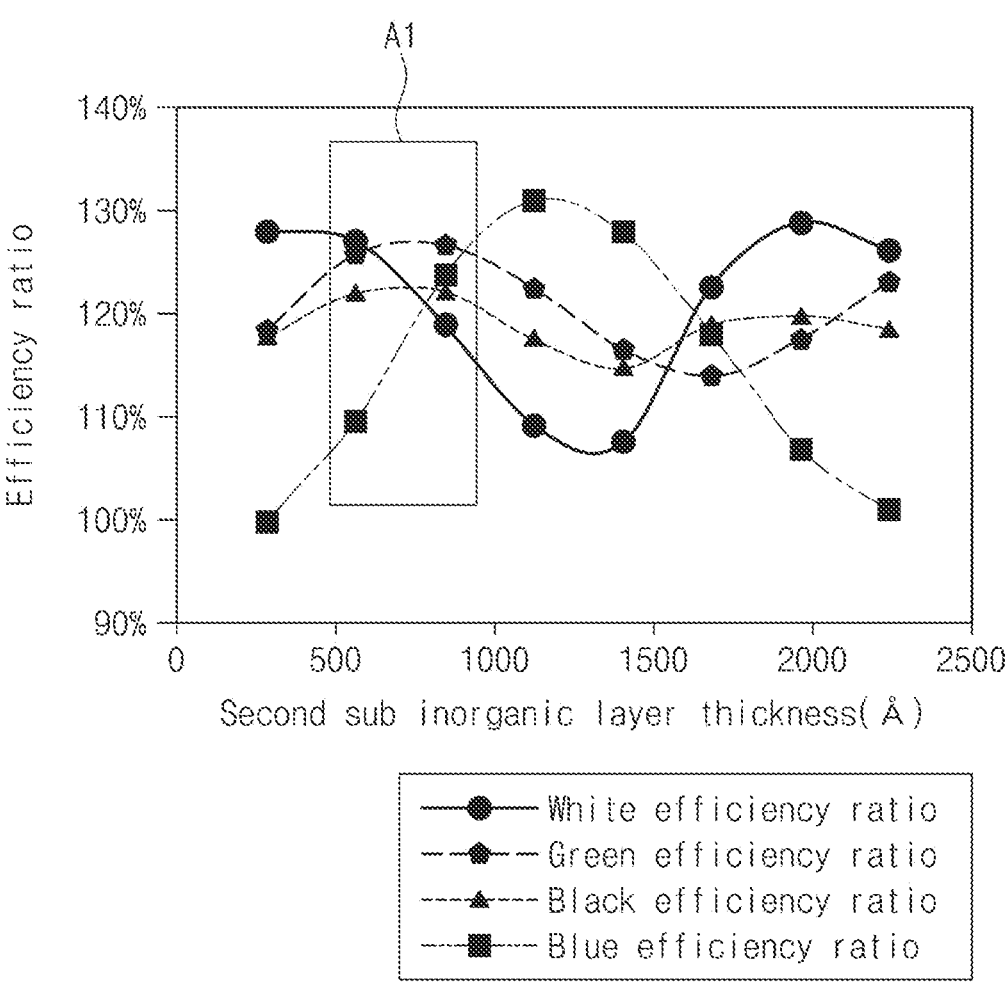
FIGS. 8A-8D are graphs each showing the efficiency ratio versus the change in the thickness of a second sub inorganic layer in the display panel according to the embodiments illustrated in FIG. 5C.
Figure 8B:
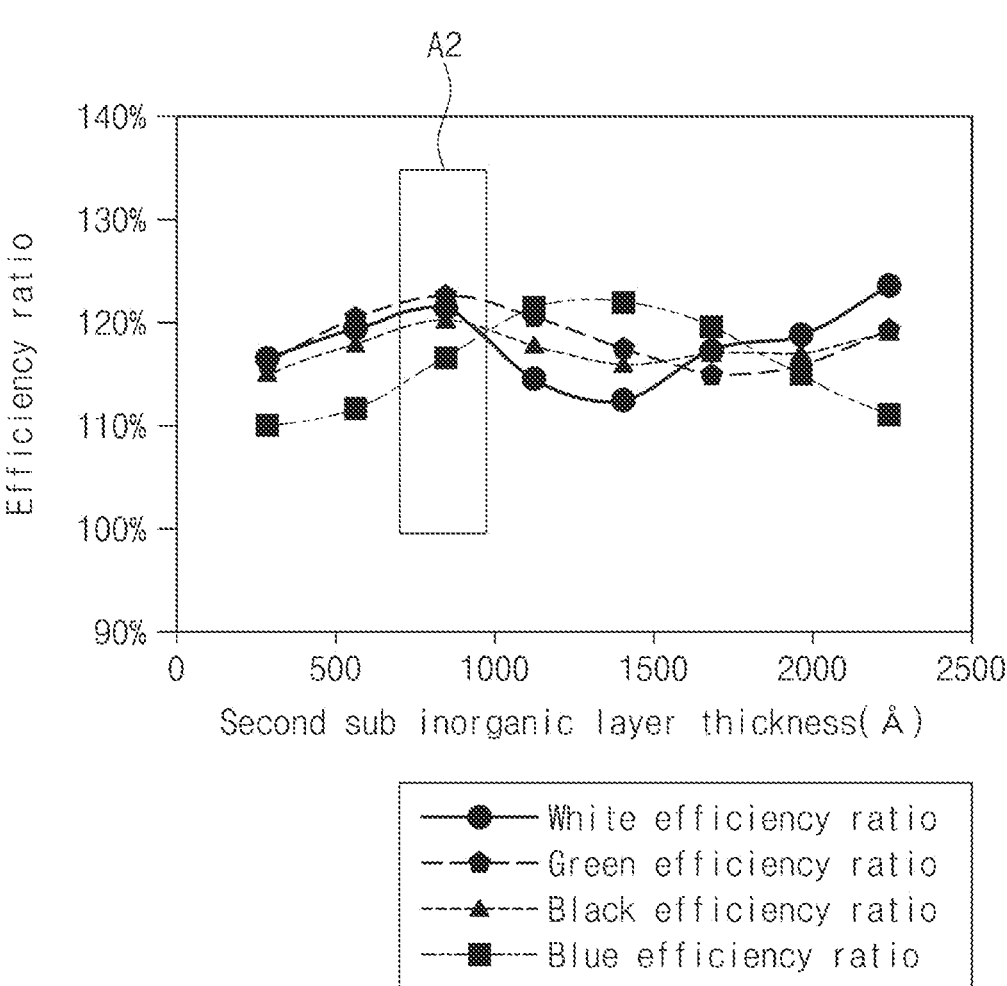
Figure 8C:
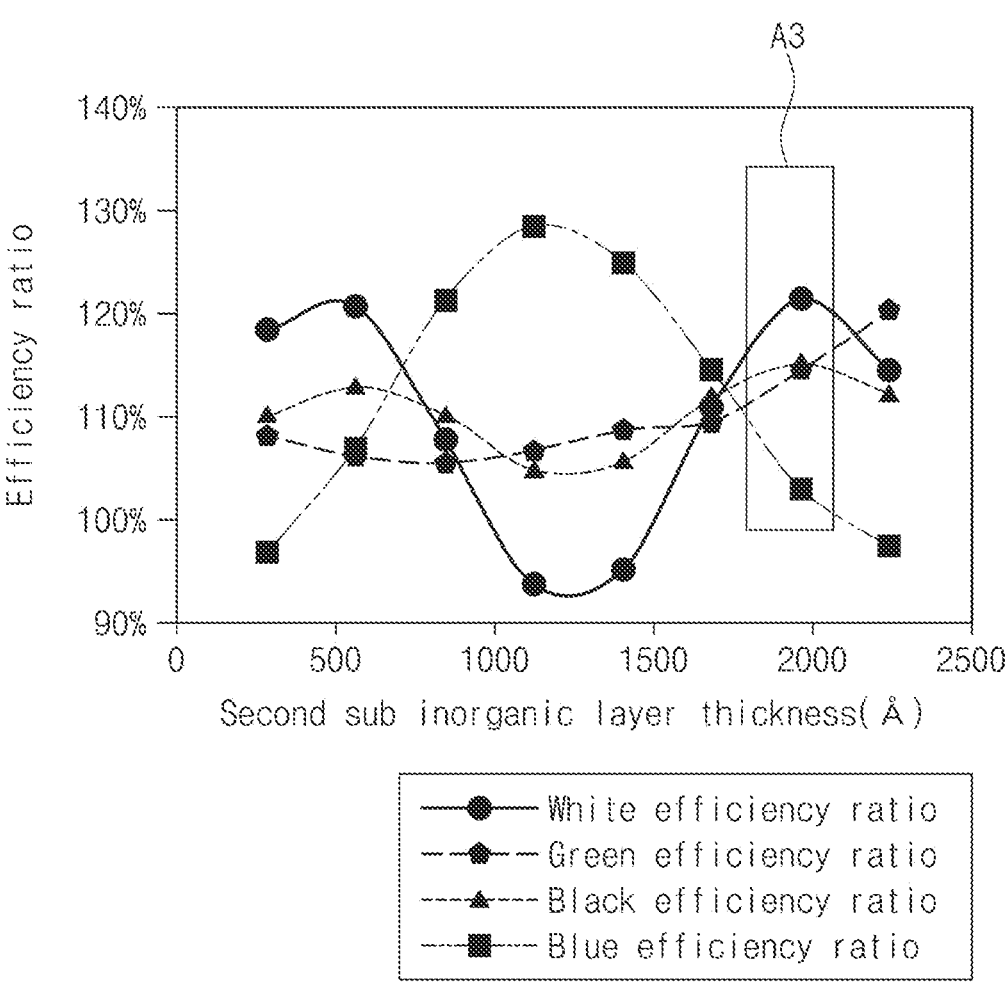
Figure 8D:
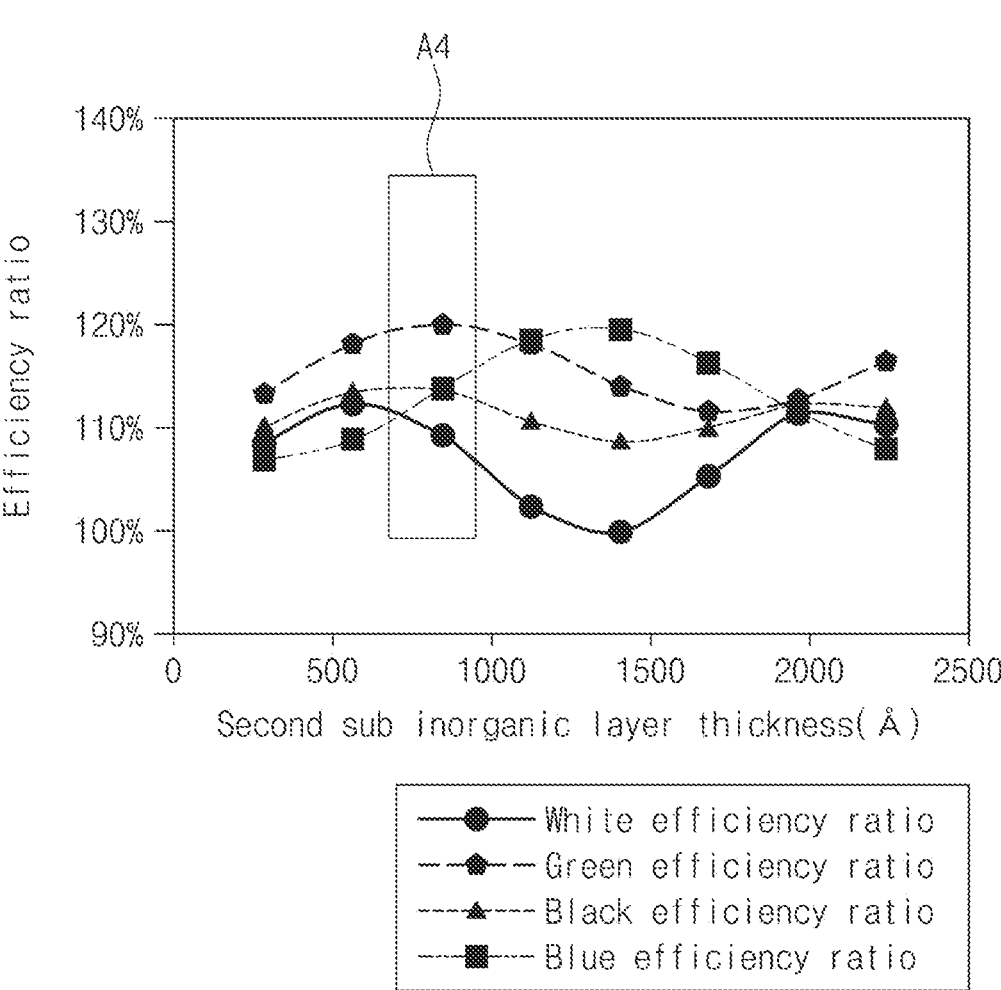

FIGS. 8A through 8D are graphs each showing the efficiency ratio versus the change in the thickness of the second sub inorganic layer in the display panel according to the embodiments illustrated in FIG. 5C. FIGS. 8A through 8D are graphs respectively showing white, red, green, and blue efficiency ratios versus the change in the thickness of the second sub inorganic layer in the display panel according to the embodiment illustrated in FIG. 5C. In FIG. 8A, the refractive index of the capping layer is about 2.05, the refractive indexes of the first sub inorganic layer, the second sub inorganic layer, and the third sub inorganic layer are about 1.89, about 1.48, and about 1.89, respectively. In FIG. 8B, the refractive index of the capping layer is about 2.05, the refractive indexes of the first sub inorganic layer, the second sub inorganic layer, and the third sub inorganic layer are about 1.89, about 1.48, and about 1.77, respectively. In FIG. 8C, the refractive index of the capping layer is about 1.97, and the refractive indexes of the first sub inorganic layer, the second sub inorganic layer, and the third sub inorganic layer are about 1.89, about 1.48, and about 1.89, respectively. In FIG. 8D, the refractive index of the capping layer is about 1.97, and the refractive indexes of the first sub inorganic layer, the second sub inorganic layer, and the third sub inorganic layer are about 1.89, about 1.48, and about 1.77, respectively. In FIGS. 8A through 8D, the thickness of the first sub inorganic layer is about 550 Å and the thickness of the third sub inorganic layer is about 9000 Å.

Referring to FIGS. 8A through 8D, in the display panel DP according to some embodiments, the third sub inorganic layer IL1-3b may have a (3-2)-th thickness T3-2 of about 7000 Å to about 10000 Å, for example, a thickness of about 9000 Å. In this case, the display panel DP may include the second sub inorganic layer IL1-2 the thickness of which is adjusted to about 800 Å to about 2000 Å according to the refractive index of the third sub inorganic layer IL1-3b and/or the refractive index of the capping layer CPL, thereby achieving improved luminous efficiency.

For example, comparing FIG. 8A and FIG. 8B, in which the refractive index of the capping layer CPL is constant and the refractive indexes of the third sub inorganic layer IL1-3b change, may demonstrate that the display panel DP according to some embodiments exhibiting the result of FIG. 8A has high efficiency in a first region A1, and the display panel DP according to some embodiments exhibiting the result of FIG. 8B has high efficiency in a second region A2. Specifically, it may be seen that the display panel DP according to some embodiments exhibiting the result of FIG. 8A has excellent efficiency when the second sub inorganic layer IL1-2 has a thickness of about 500 Å to about 900 Å. It may be also seen that the display panel DP according to some embodiments exhibiting the result of FIG. 8B has excellent efficiency when the second sub inorganic layer IL1-2 has a thickness of about 800 Å to about 1000 Å.

Furthermore, comparing FIG. 8C and FIG. 8D in which the refractive index of the capping layer CPL is constant, and the refractive indexes of the third sub inorganic layer IL1-3b change, may demonstrate that the display panel DP according to some embodiments exhibiting the result of FIG. 8C has high efficiency in a third region A3, and the display panel DP according to some embodiments exhibiting the result of FIG. 8D has high efficiency in a fourth region A4. It may be seen that the display panel DP according to some embodiments exhibiting the result of FIG. 8C has high efficiency when the second sub inorganic layer IL1-2 has a thickness of about 1800 Å to about 2000 Å. In addition, it may be seen that the display panel DP according to some embodiments exhibiting the result of FIG. 8D has high efficiency when the second sub inorganic layer IL1-2 has a thickness of about 700 Å to about 900 Å.

A display panel according to some embodiments may include a multi-layered first inorganic layer disposed on an inorganic absorption layer, and the refractive index and/or the thickness of the multi-layered first inorganic layer may be adjusted, thereby achieving improved luminous efficiency. As a result, a display device according to some embodiments may have improved light extraction efficiency, and thus have a characteristic of providing the image with improved quality.

Embodiments may provide a display panel with improved luminous efficiency by including a multi-layered first inorganic layer disposed on an inorganic absorption layer, and by adjusting the refractive index and/or the thickness of the multi-layered first inorganic layer.

Furthermore, a display device according to some embodiments may include the display panel described above and have improved light extraction efficiency, thereby providing the image with improved quality.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present. Further, the phrase "directly disposed" may mean that there is no layer, film, region, plate or the like between a portion of a layer, film, region, plate or the like and another portion. For example, "directly disposed" may mean that one or more adhesive members are not disposed between two layers or two members.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having,"

when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
   a base layer;
   a light-emitting element layer on the base layer;
   a capping layer on the light-emitting element layer;
   an inorganic absorption layer on the capping layer, and having a refractive index of about 1.8 to about 3.0; and
   an encapsulation layer on the inorganic absorption layer, and comprising a first layer, a second layer, and a third layer that are sequentially stacked, wherein the first layer comprises:

a first sub layer on the inorganic absorption layer, and having a first refractive index of about 1.77 or more;

a second sub layer on the first sub layer, and having a second refractive index lower than the first refractive index; and a third sub layer on the second sub layer, and having a third refractive index lower than the first refractive index or higher than the second refractive index.

2. The display panel of claim 1, wherein the second refractive index is about 1.5 or less.

3. The display panel of claim 2, wherein the first sub layer has a thickness of about 500 Å to about 600 Å or about 1500 Å to about 1750 Å, and the second sub layer has a thickness of about 7000 Å to about 10000 Å.

4. The display panel of claim 1, wherein the second refractive index is about 1.5 or less, and the third refractive index is about 1.70 or less.

5. The display panel of claim 4, wherein the third refractive index is about 0.

6. The display panel of claim 4, wherein the first sub layer has a thickness of about 500 Å to about 600 Å, the second sub layer has a thickness of about 7000 Å to about 10000 Å, and the third sub layer has a thickness of about 550 Å to about 750 Å.

7. The display panel of claim 1, wherein the third sub layer has a thickness of about 7000 Å to about 10000 Å.

8. The display panel of claim 7, wherein the second refractive index is about 1.5 or less, and the third refractive index is about 1.65 or more.

9. The display panel of claim 7, wherein the first sub layer has a thickness of about 500 Å to about 600 Å, and the second sub layer has a thickness of about 800 Å to about 2000 Å.

10. The display panel of claim 7, wherein a refractive index of the capping layer is higher than the refractive index of the inorganic absorption layer, and a difference between the refractive index of the capping layer and the refractive index of the inorganic absorption layer is about 0.15 or more.

11. The display panel of claim 1, wherein the first layer comprises silicon oxynitride ($SiO_xN_y$).

12. The display panel of claim 1, wherein the inorganic absorption layer comprises bismuth (Bi).

13. A display panel comprising:

a base layer;

a light-emitting element layer on the base layer;

a capping layer on the light-emitting element layer;

an inorganic absorption layer on the capping layer; and an encapsulation layer on the inorganic absorption layer, and comprising a first layer, a second layer, and a third layer that are sequentially stacked, wherein the first layer comprises a first sub layer and a second sub layer, each of the first and second sub layers comprising silicon oxynitride ($SiO_xN_y$), the silicon oxynitride ($SiO_xN_y$) of the first sub layer having a higher nitrogen content than the silicon oxynitride ($SiO_xN_y$) of the second sub layer.

14. The display panel of claim 13, wherein the first sub layer has a first refractive index of about 1.77 or more, and has a thickness of about 500 Å to about 600 Å or about 1500 Å to about 1750 Å, and wherein the second sub layer has a second refractive index of about 1.5 or less, and has a thickness of about 7000 Å to about 10000 Å.

15. The display panel of claim 13, wherein the first layer further comprises a third sub layer comprising silicon oxynitride ($SiO_xN_y$), the first sub layer, the second sub layer, and the third sub layer are sequentially stacked on the inorganic absorption layer.

16. The display panel of claim 15, wherein the silicon oxynitride ($SiO_xN_y$) of the third sub layer has a lower nitrogen content than the silicon oxynitride ($SiO_xN_y$) of the first sub layer.

17. The display panel of claim 15, wherein the silicon oxynitride ($SiO_xN_y$) of the third sub layer has a higher nitrogen content than the silicon oxynitride ($SiO_xN_y$) of the second sub layer.

18. The display panel of claim 16, wherein the first sub layer has a thickness of about 500 Å to about 600 Å, the second sub layer has a thickness of about 7000 Å to about 10000 Å, and the third sub layer has a thickness of about 550 Å to about 750 Å.

19. The display panel of claim 17, wherein the first sub layer has a thickness of about 500 Å to about 600 Å, the second sub layer has a thickness of about 800 Å to about 2000 Å, and the third sub layer has a thickness of about 7000 Å to about 10000 Å.

20. A display device comprising:

a display panel;

a sensor layer on the display panel; and a light control layer on the sensor layer, and comprising at least one of a dye or a pigment, wherein the display panel comprises:

a base layer, a light-emitting element layer on the base layer, an inorganic absorption layer on the light-emitting element layer, and an encapsulation layer on the inorganic absorption layer, and comprising at least one inorganic layer and at least one organic layer, the at least one inorganic layer comprising:

a first sub inorganic layer having a first refractive index of about 1.77 or more; and a second sub inorganic layer on the first sub inorganic layer, and having a second refractive index lower than the first refractive index, and wherein the encapsulation layer comprises:

a first inorganic layer on the inorganic absorption layer, and comprising the first sub inorganic layer and the second sub inorganic layer;

an organic layer on the first inorganic layer.

21. The display device of claim 20, wherein the encapsulation layer further comprises:

a second inorganic layer on the organic layer.

22. The display device of claim 21, wherein the first inorganic layer further comprises a third sub inorganic layer on the second sub inorganic layer, and the first inorganic layer has a third refractive index lower than the first refractive index or having a fourth refractive index higher than the second refractive index, and the first sub inorganic layer is directly on the inorganic absorption layer.

* * * * *